US012028068B2

(12) United States Patent
Watanabe et al.

(10) Patent No.: US 12,028,068 B2
(45) Date of Patent: Jul. 2, 2024

(54) SEMICONDUCTOR DEVICE

(71) Applicant: Kioxia Corporation, Tokyo (JP)

(72) Inventors: Fumiya Watanabe, Ota Tokyo (JP);
Toshifumi Watanabe, Yokohama Kanagawa (JP); Kazuhiko Satou, Yokohama Kanagawa (JP); Shouichi Ozaki, Komae Tokyo (JP); Kenro Kubota, Fujisawa Kanagawa (JP); Atsuko Saeki, Yokohama Kanagawa (JP); Ryota Tsuchiya, Kamakura Kanagawa (JP); Harumi Abe, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/178,038

(22) Filed: Mar. 3, 2023

(65) Prior Publication Data
US 2024/0097658 A1 Mar. 21, 2024

(30) Foreign Application Priority Data
Sep. 16, 2022 (JP) .................................. 2022-148456

(51) Int. Cl.
*H03K 3/011* (2006.01)
*G11C 7/10* (2006.01)
*H03K 17/14* (2006.01)
*H03K 19/20* (2006.01)

(52) U.S. Cl.
CPC ............ *H03K 3/011* (2013.01); *G11C 7/1048* (2013.01); *H03K 17/14* (2013.01); *G11C 2207/2254* (2013.01); *H03K 19/20* (2013.01)

(58) Field of Classification Search
CPC ........ H03K 3/011; H03K 17/14; H03K 19/20; G11C 7/1048; G11C 2207/2254
USPC .......................................................... 327/109
See application file for complete search history.

(56) References Cited

U.S. PATENT DOCUMENTS

| 7,528,626 | B2* | 5/2009 | Kim | ................... H03K 19/0005 |
| | | | | 326/30 |
| 7,710,143 | B2* | 5/2010 | Jeong | ................... G11C 7/1048 |
| | | | | 326/16 |
| 9,077,332 | B2* | 7/2015 | Ko | ................. H03K 19/018557 |
| 9,317,052 | B1* | 4/2016 | Hwang | ................... G05F 1/468 |
| 10,255,969 | B2* | 4/2019 | Eom | ................... G11C 11/4096 |

(Continued)

FOREIGN PATENT DOCUMENTS

JP 2018-152147 A 9/2018

*Primary Examiner* — Ryan Jager
(74) *Attorney, Agent, or Firm* — Kim & Stewart LLP

(57) ABSTRACT

A semiconductor device includes a first pad, a second pad, a first output driver provided for the first pad and configured to output a first transmission signal to the first pad, a second output driver provided for the second pad and configured to output a second transmission signal to the second pad, a register that stores first and second calibration values, a first reference resistor for the first pad and having a resistance value that is set according to the first calibration value, a second reference resistor for the second pad and having a resistance value that is set according to the second calibration value, a first setting circuit configured to calibrate a resistance value of the first output driver using the first reference resistor, and a second setting circuit configured to calibrate a resistance value of the second output driver using the second reference resistor.

20 Claims, 13 Drawing Sheets

(56) References Cited

U.S. PATENT DOCUMENTS

| | | | | |
|---|---|---|---|---|
| 10,276,218 B2* | 4/2019 | Hirashima | ............... | G11C 7/20 |
| 11,152,939 B2* | 10/2021 | Kang | ............. | H03K 19/018578 |
| 11,196,418 B1* | 12/2021 | Suryanarayana | .... | G11C 29/028 |
| 11,431,338 B1* | 8/2022 | Kang | ................... | G11C 29/028 |
| 11,495,280 B2* | 11/2022 | Seo | ........................ | H01L 25/18 |
| 2018/0261260 A1* | 9/2018 | Hirashima | ........... | G11C 7/1057 |
| 2021/0099172 A1* | 4/2021 | Kang | ................. | H03K 19/0005 |
| 2022/0263507 A1* | 8/2022 | Kang | .............. | G11C 29/50008 |

\* cited by examiner

SEMICONDUCTOR DEVICE

CROSS-REFERENCE TO RELATED APPLICATION

This application is based upon and claims the benefit of priority from Japanese Patent Application No. 2022-148456, filed Sep. 16, 2022, the entire contents of which are incorporated herein by reference.

FIELD

Embodiments described herein relate generally to a semiconductor device.

BACKGROUND

In the related art, an output driver of an off-chip driver (OCD) circuit capable of high-speed transmission employs a calibration circuit that performs calibration for reducing impedance deviation (hereinafter referred to as ZQ calibration) due to temperature and voltage fluctuations. The calibration circuit adjusts the on-resistance of the transistors of the output driver.

However, ZQ calibration requires a relatively long time to calculate adjustment values, and accurate adjustment is difficult.

DETAILED DESCRIPTION

Embodiments provide a semiconductor device that enables accurate calibration without relying on ZQ calibration.

In general, according to one embodiment, a semiconductor device includes: a first pad, a second pad, a first output driver that is provided for the first pad and configured to output a first transmission signal to the first pad, a second output driver that is provided for the second pad and configured to output a second transmission signal to the second pad, a register that stores first and second calibration values, a first reference resistor for the first pad and having a resistance value that is set according to the first calibration value, a second reference resistor for the second pad and having a resistance value that is set according to the second calibration value, a first setting circuit configured to calibrate a resistance value of the first output driver using the first reference resistor, and a second setting circuit configured to calibrate a resistance value of the second output driver using the second reference resistor.

Hereinafter, embodiments of the present disclosure will be described in detail with reference to the drawings.

First Embodiment

A semiconductor device such as a NAND memory has a plurality of DQ pads for transmission of various signals. In general, with ZQ calibration, one external resistor is used to obtain an adjustment value for adjusting the on-resistance of an output driver connected to one ZQ pad, and the obtained adjustment value is used to calibrate the on-resistance of the output drivers connected to all the DQ pads. However, the output drivers connected to the respective DQ pads are located at different positions on the chip, and the characteristics of the transistors of the output drivers may differ due to variations in the manufacturing process. Therefore, in the above case, when the on-resistance of the output drivers connected to the respective DQ pads is uniformly set in the chip, there is a likelihood that variations in output characteristics between the output drivers cannot be corrected. Therefore, in order to set the on-resistances of all output drivers without variation, one external resistor may be used and the on-resistances of the output drivers for each OCD circuit connected to each DQ pad sequentially calibrated. However, in this case, it is necessary to obtain an adjustment value for each of output drivers connected to all DQ pads, and it takes an extremely long time to perform ZQ calibration.

Therefore, in the present embodiment, by providing a reference resistor in each OCD circuit provided for each DQ pad, ZQ calibration of the output drivers of each DQ can be performed simultaneously. Although an example in which the present embodiment is applied to an output driver of a NAND memory will be described, the present disclosure is not limited thereto.

Configuration of Memory System

Figure 1:
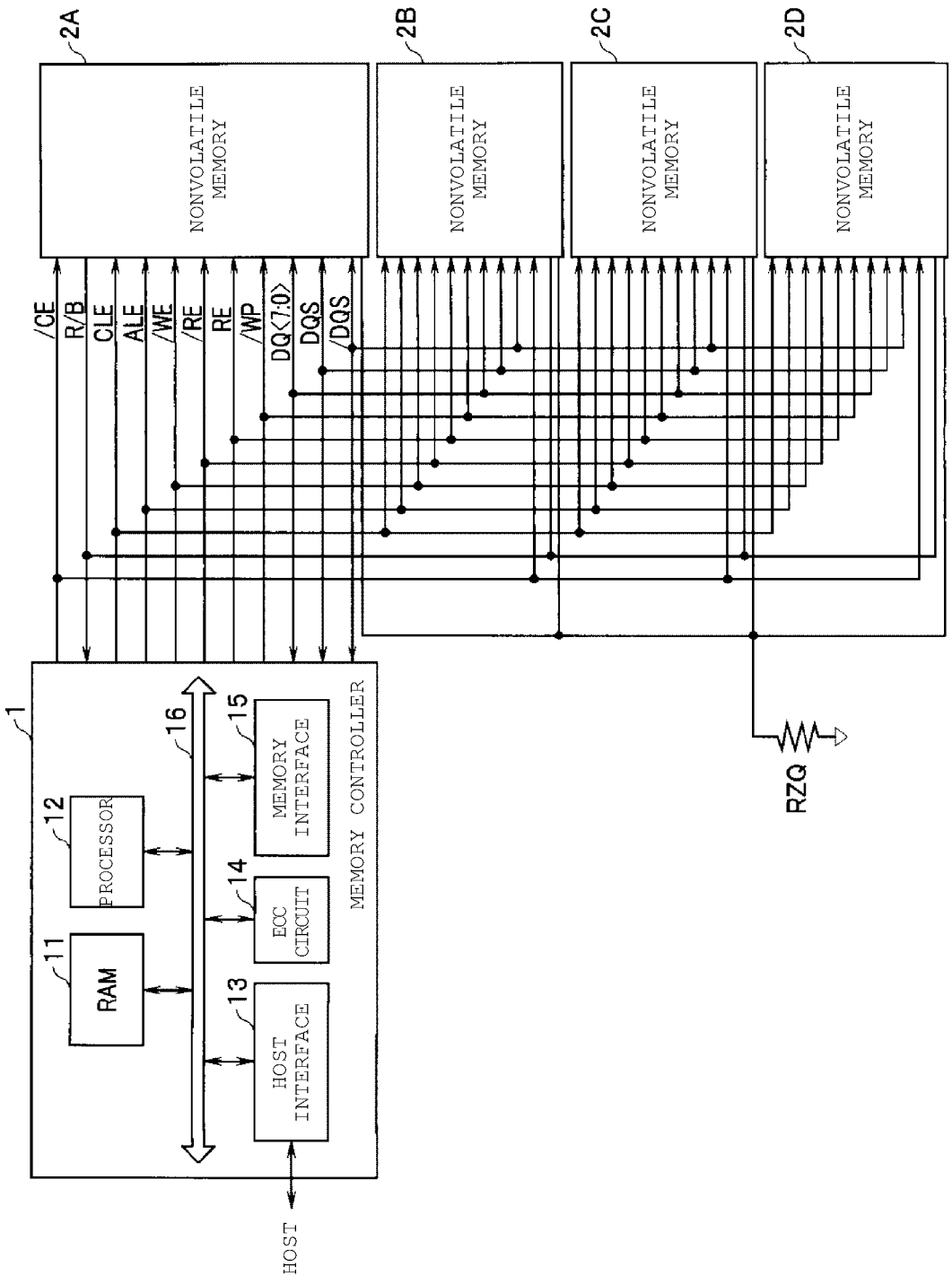
FIG. 1 is a block diagram showing a configuration example of a memory system according to an embodiment.

FIG. 1 is a block diagram showing a configuration example of a memory system according to an embodiment. The memory system of the present embodiment includes a memory controller 1 and nonvolatile memories 2A to 2D (hereinafter, these nonvolatile memories 2A to 2D will be referred to as a nonvolatile memory 2 when there is no need to distinguish between them). A memory system is connectable with a host. A host is, for example, an electronic device such as a personal computer or a mobile terminal.

The nonvolatile memory 2 is a semiconductor device that stores data in a nonvolatile manner, and is configured with, for example, a NAND memory. In the present embodiment, the nonvolatile memory 2 may be a NAND memory having memory cell transistors capable of storing 3 bits per memory cell transistor, that is, a 3-bit/cell (triple level cell: TLC) NAND memory, but the present disclosure is not limited thereto. The nonvolatile memory 2 is three-dimensional.

The memory controller 1 controls writing of data to the nonvolatile memory 2 in accordance with a write request from the host. In addition, the memory controller 1 controls reading of data from the nonvolatile memory 2 in accordance with a read request from the host. The memory controller 1 includes a random access memory (RAM) 11, a processor 12, a host interface 13, an error check and correct (ECC) circuit 14 and a memory interface 15. The RAM 11, the processor 12, the host interface 13, the ECC circuit 14, and the memory interface 15 are connected to each other via an internal bus 16.

The host interface 13 outputs requests received from the host, write data which is user data, and the like to the internal bus 16. Also, the host interface 13 transmits user data read from the nonvolatile memory 2, responses from the processor 12, and the like to the host.

The memory interface 15 controls a process of writing user data and the like to the nonvolatile memory 2 and a process of reading from the nonvolatile memory 2 based on instructions from the processor 12.

The processor 12 controls the memory controller 1. The processor 12 is, for example, a central processing unit (CPU), a micro processing unit (MPU), or the like. Upon receiving a request from the host via the host interface 13, the processor 12 performs control according to the request. For example, the processor 12 instructs the memory interface 15 to write user data and parity to the nonvolatile memory 2 in accordance with a request from the host. Also, the processor 12 instructs the memory interface 15 to read user data and parity from the nonvolatile memory 2 in accordance with a request from the host.

The processor 12 determines a storage area (hereinafter referred to as a memory area) in the nonvolatile memory 2 for user data stored in the RAM 11. The user data is stored in the RAM 11 via the internal bus 16. The processor 12 determines a memory area for page-based data (or simply page data), which is a unit of writing. In the present specification, user data stored in one page of the nonvolatile memory 2 is defined as unit data. The unit data is encoded and stored in the nonvolatile memory 2 as codewords, for example.

Encoding is optional. The memory controller 1 may store unit data in the nonvolatile memory 2 without encoding, but FIG. 1 shows a configuration in which encoding is performed as a configuration example. When the memory controller 1 does not perform encoding, the page data will match the unit data. Further, one codeword may be generated based on one unit data, or one codeword may be generated based on divided data obtained by dividing unit data. Also, one codeword may be generated using a plurality of pieces of unit data.

The processor 12 determines a memory area of the nonvolatile memory 2 to which each piece of unit data is written. Physical addresses are allocated to the memory areas of the nonvolatile memory 2. The processor 12 manages the memory area to which unit data is written using physical addresses. The processor 12 designates the physical address of the determined memory area and instructs the memory interface 15 to write the user data to the nonvolatile memory 2. The processor 12 manages correspondence between logical addresses of user data (logical addresses managed by the host) and physical addresses. When the processor 12 receives a read request including a logical address from the host, the processor 12 identifies a physical address corresponding to the logical address, designates the physical address, and instructs the memory interface 15 to read user data.

The ECC circuit 14 encodes the user data stored in the RAM 11 to generate codewords. Also, the ECC circuit 14 decodes codewords read from the nonvolatile memory 2.

The RAM 11 temporarily stores user data received from the host until it is stored in the nonvolatile memory 2, or temporarily stores data read from the nonvolatile memory 2 until it is transmitted to the host. The RAM 11 is, for example, a general-purpose memory such as a static random access memory (SRAM) or a dynamic random access memory (DRAM).

FIG. 1 shows a configuration example in which the memory controller 1 includes the ECC circuit 14 and the memory interface 15. However, the ECC circuit 14 may be built into the memory interface 15. Also, the ECC circuit 14 may be built into the nonvolatile memory 2.

When receiving a write request from the host, the memory controller 1 operates as follows. The processor 12 causes the RAM 11 to temporarily store the write data. The processor 12 reads data stored in the RAM 11 and inputs the data to the ECC circuit 14. The ECC circuit 14 encodes the input data and provides a codeword to the memory interface 15. The memory interface 15 writes the input codeword to the nonvolatile memory 2.

When receiving a read request from the host, the memory controller 1 operates as follows. The memory interface 15 provides the codeword read from the nonvolatile memory 2 to the ECC circuit 14. The ECC circuit 14 decodes the input codeword and stores the decoded data in the RAM 11. The processor 12 transmits data stored in the RAM 11 to the host via the host interface 13.

Schematic Configuration of Nonvolatile Memory

Figure 2:
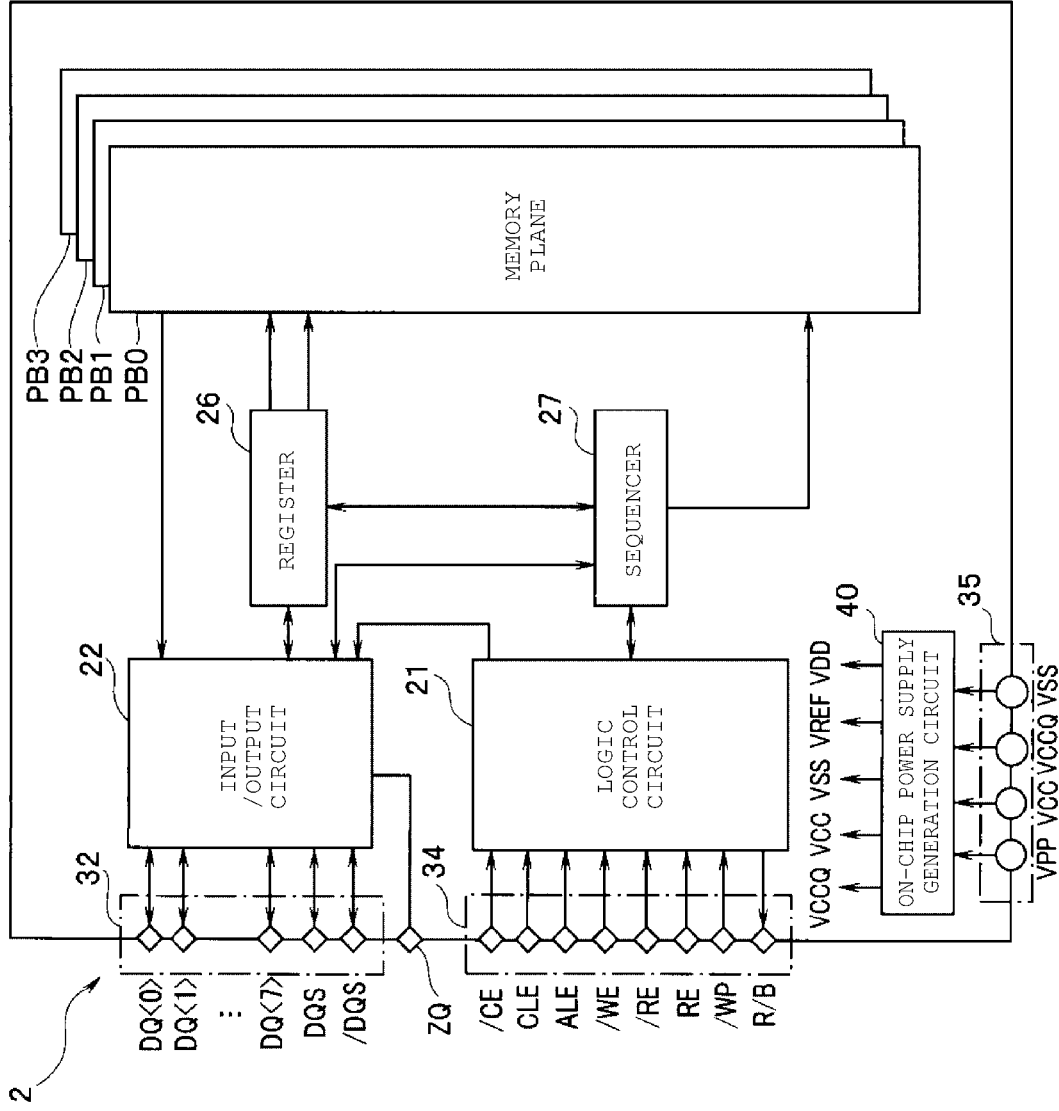
FIG. 2 is a block diagram showing a configuration example of a nonvolatile memory according to the present embodiment.

FIG. 2 is a block diagram showing a configuration example of the nonvolatile memory of the present embodiment.

The nonvolatile memory 2 includes a logic control circuit 21, an input/output circuit 22, a register 26, a sequencer 27, an input/output pad group 32, a logic control pad group 34, a power supply input pad group 35, a plurality of planes PB0, PB1, . . . (hereinafter, these planes PB0, PB1, . . . will be referred to as a plane PB when there is no need to distinguish between them), and an on-chip power supply generation circuit 40. Although FIG. 2 shows an example in which the plane PB has four planes, the number of planes provided in the nonvolatile memory 2 is not limited thereto. For example, the number of planes provided in the nonvolatile memory 2 may be 2, 3, 8, 16, and the like.

The input/output pad group 32 includes a plurality of terminals (pads) corresponding to signals DQ<7:0> and corresponding to data strobe signals DQS and /DQS in order to communicate each signal including data to/from the memory controller 1.

A signal prefixed with a symbol "/" indicates active low or negative logic. That is, a signal not prefixed with a symbol "/" becomes active at "H" level, while a signal prefixed with a symbol "/" becomes active at "L" level.

The logic control pad group 34 includes a plurality of terminals (pads) corresponding to a chip enable signal /CE, a command latch enable signal CLE, an address latch enable signal ALE, a write enable signal /WE, read enable signals RE and /RE, a write protect signal /WP, and a ready/busy signal R/B in order to communicate each signal to/from the memory controller 1.

The signal /CE enables the nonvolatile memory 2 to be selected. The signal CLE enables commands transmitted as a signal DQ to be latched into a command register. The signal ALE enables addresses transmitted as a signal DQ to be latched into an address register. The signal /WE enables writing. The signals RE and /RE enable reading. The signal /WP inhibits writing and erasing. The signal R/B indicates whether the nonvolatile memory 2 is in a ready state (a state in which it is possible to receive commands from the outside) or a busy state (a state in which it is not possible to receive commands from the outside). The memory controller 1 can know the state of the nonvolatile memory 2 by the signal R/B.

The power supply input pad group 35 includes a plurality of power supply pads for inputting power supply voltages VCC, VCCQ, and VPP and a ground voltage VSS in order to supply various operating power supplies to the nonvolatile memory 2 from the outside. The power supply voltage VCC is a circuit power supply voltage generally supplied from the outside as an operating power supply, and is a voltage of about 3.3 V, for example. The power supply voltage VCCQ is, for example, a voltage of 1.2 V. The power supply voltage VCCQ is used when signals are communicated between the memory controller 1 and the nonvolatile memory 2. The power supply voltage VPP is a power supply voltage higher than the power supply voltage VCC, and is, for example, a voltage of 12 V.

Various voltages from the power supply input pad group 35 are supplied to the on-chip power supply generation circuit 40. Each power supply pad of the power supply input pad group 35 is supplied with the various power supply voltages described above directly or via the memory controller 1 from an external power supply circuit. The on-chip power supply generation circuit 40 uses the power supply voltage supplied via the power supply input pad group 35 to generate an internal power supply voltage for operating each unit of the nonvolatile memory 2. That is, the on-chip power supply generation circuit 40 is supplied with voltages VPP, VCC, VCCQ, and VSS via the power supply pads of the power supply input pad group 35, supplies the voltages VCC, VCCQ, and VSS to each unit of the nonvolatile memory 2 as they are, and also generates voltages VRFF and VDD and supplies the voltages VRFF and VDD to each unit of the nonvolatile memory 2. The on-chip power supply generation circuit 40 generates the power supply voltage VDD using the voltage VCC input via the power supply pad VCC, and supplies the generated power supply voltage VDD to each unit of the nonvolatile memory 2 via the VDD wiring.

The logic control circuit 21 and the input/output circuit 22 are connected to the memory controller 1 via a NAND bus. The input/output circuit 22 communicates signals DQ (for example, DQ0 to DQ7) to/from the memory controller 1 via the NAND bus.

The logic control circuit 21 receives an external control signal (for example, a chip enable signal /CE, a command latch enable signal CLE, an address latch enable signal ALE, a write enable signal /WE, read enable signals RE and /RE, and a write protect signal /WP from the memory controller 1 via the NAND bus). Also, the logic control circuit 21 transmits a ready/busy signal R/B to the memory controller 1 via the NAND bus.

The register 26 includes a command register, an address register, a status register, and the like. The command register temporarily stores commands. The address register temporarily stores addresses. The status register temporarily stores data required for the operation of the nonvolatile memory 2. The register 26 is configured with, for example, an SRAM.

The sequencer 27 is a control circuit that receives a command from the register 26 and controls the nonvolatile memory 2 in accordance with a sequence based on this command.

Each plane PB is provided with a voltage generating circuit, a memory cell array, a sense amplifier and a row decoder (not shown). A memory cell array includes a plurality of memory cell transistors (memory cells). In order to control a voltage applied to the memory cell transistors, each plane PB is provided with a plurality of bit lines, a plurality of word lines, a source line, and the like.

A voltage generated by a voltage generating circuit is applied to a sense amplifier and a row decoder, and various voltages are supplied to a plurality of bit lines, a plurality of word lines, a source line, and the like by the sense amplifier and the row decoder to perform write operations, read operations, and erasing operations on memory cell transistors.

Figure 3:
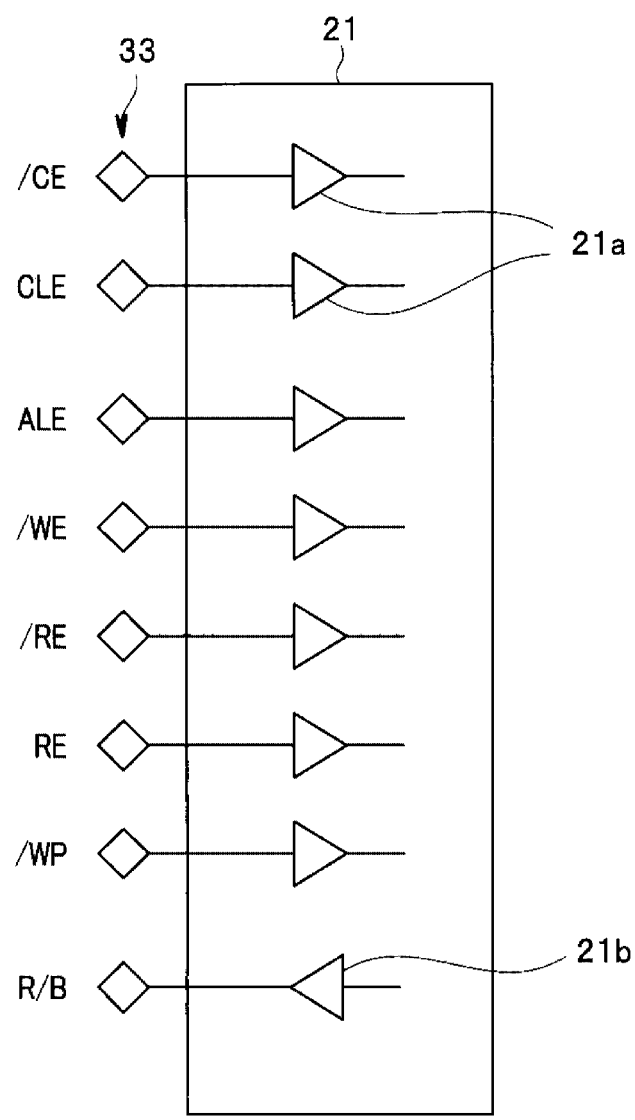
FIG. 3 is a circuit diagram showing a part of a configuration of a logic control circuit.

FIG. 3 is a circuit diagram showing a part of a configuration of the logic control circuit 21. The logic control circuit 21 includes an input receiver 21a and/or an output driver 21b for each terminal of a logic control pad group 33. The input receiver 21a receives signals input via each terminal. The output driver 21b transmits signals to be output via each terminal.

Figure 4:
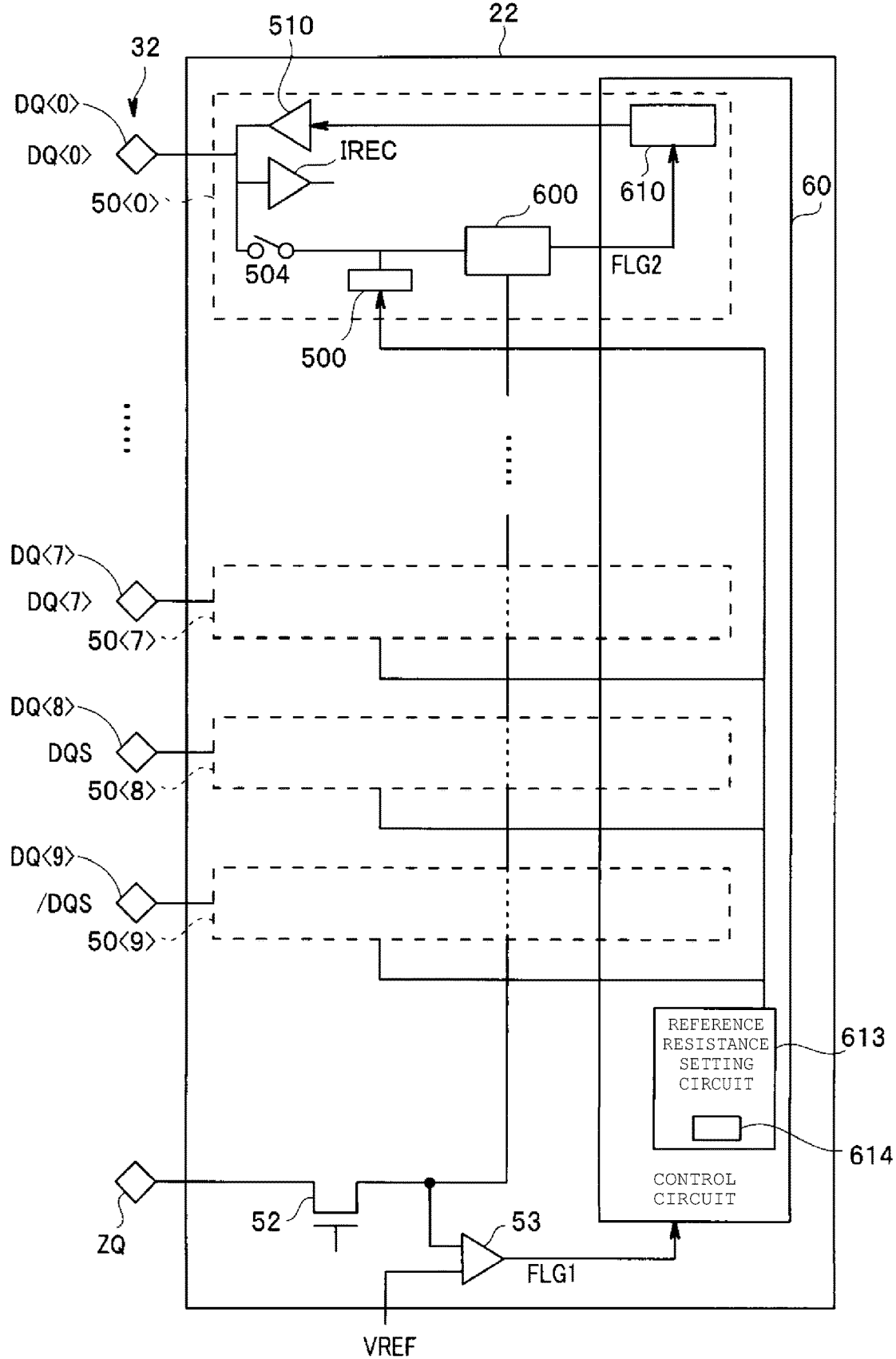
FIG. 4 is a block diagram showing a configuration of a part of an input/output circuit.

FIG. 4 is a block diagram showing a configuration of a part of the input/output circuit 22. As shown in FIG. 4, the input/output circuit 22 includes OCD circuits 50<0> to 50<9> (hereinafter, these OCD circuits 50<0> to 50<9> will be referred to as a OCD circuit 50 when not distinguished from each other) connected to pads DQ<0> to DQ<9> (hereinafter, these pads DQ<0> to DQ<9> will be representatively referred to as a pad DQ<x> (x is 0 to 9)) as pads DQ<x> (x is 0 to 9)) of the input/output pad group 32, respectively.

The OCD circuits 50<0> to 50<9> have the same configuration. The OCD circuit 50 includes an input receiver IREC and an output driver 510. The input receiver IREC receives signals input via each pad DQ<x>, and the output driver 510 outputs signals to be transmitted via each pad DQ<x>.

The OCD circuit 50 also includes a resistor circuit 500, a determination circuit 600, a Ron setting circuit 610, and a switch 504. The switch 504 connects or disconnects a current path between an output terminal of the output driver 510 and the resistor circuit 500 and between the output terminal of the output driver 510 and the determination circuit 600.

The input/output circuit 22 includes a control circuit 60. The control circuit 60 may be configured with a processor using a central processing unit (CPU), a field programmable gate array (FPGA), or the like. The control circuit 60 may operate in accordance with a program stored in a memory (not shown) to control each unit, or may implement some or all of its functions with a hardware electronic circuit.

The control circuit 60 controls each OCD circuit 50. The control circuit 60 includes a reference resistance setting circuit 613. The reference resistance setting circuit 613 sets a resistance value (described later) of the resistor circuit 500 provided in each OCD circuit 50.

The input/output circuit 22 includes a switch 52 and a comparator 53. The switch 52 has one end connected to a pad ZQ for connection to an external resistor and the other end connected to each OCD circuit 50. The switch 52 is turned on and off under the control of the control circuit 60 to connect or disconnect a current path between the pad ZQ and the determination circuit 600 of each OCD circuit 50. One input terminal of the comparator 53 is connected to the other end of the switch 52. A voltage VREF from the on-chip power supply generation circuit 40 is supplied to the other input terminal of the comparator 53. The comparator 53 compares the voltage at the other end of the switch 52 with the voltage VREF and outputs a signal FLG1 based on the difference between the two voltages to the control circuit 60. The reference resistance setting circuit 613 in the control circuit 60 uses this signal FLG1 to set the resistance value of the resistor circuit 500 as will be described later.

Figure 5:
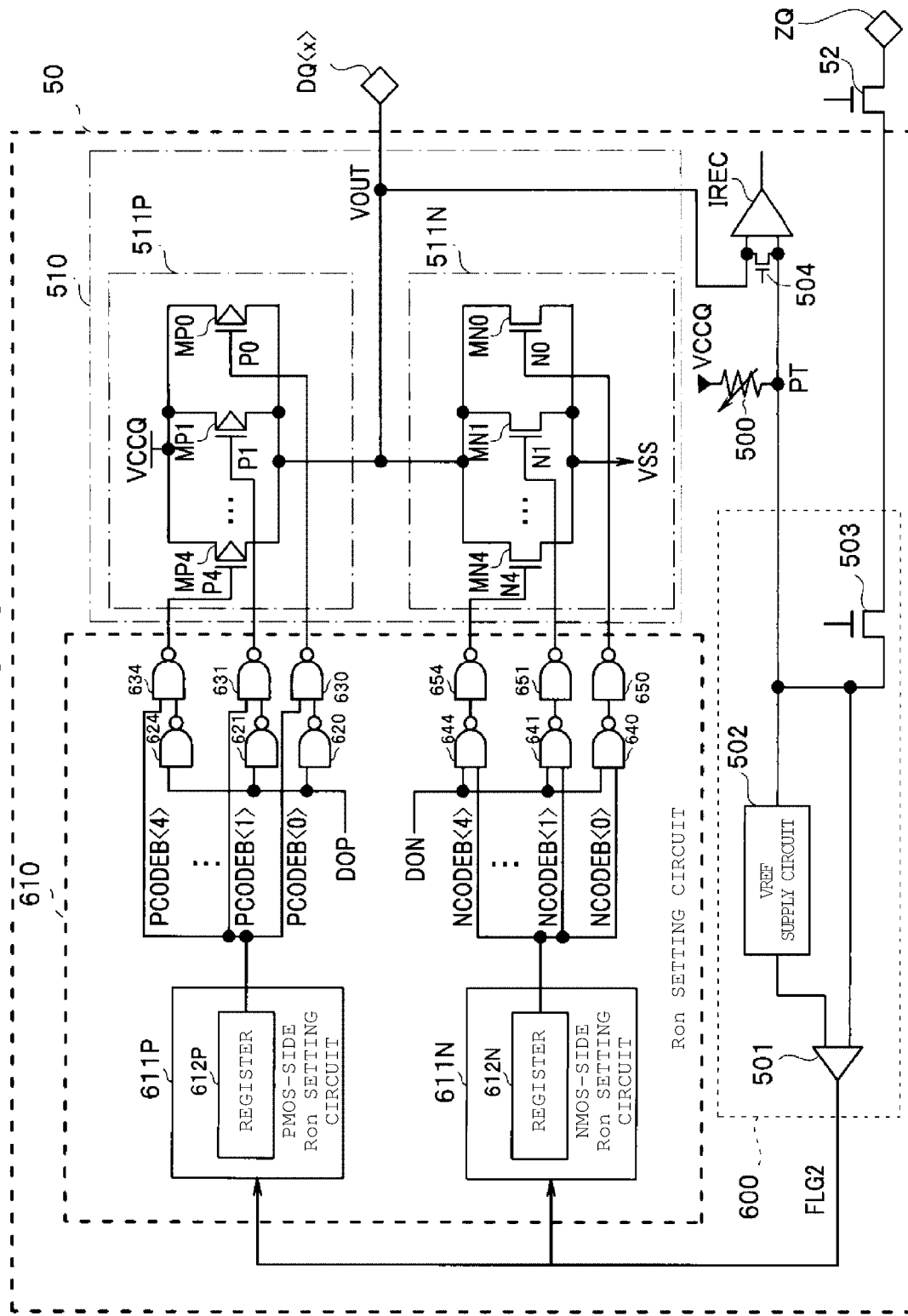
FIG. 5 is a circuit diagram showing an example of a configuration of an OCD circuit.

FIG. 5 is a circuit diagram showing an example of the configuration of the OCD circuit 50. The OCD circuits 50<0> to <9> are connected to corresponding pads DQ<0> to DQ<9> of the input/output pad group 32, respectively. The OCD circuit 50 includes an input receiver IREC that receives a signal input via the pad DQ<x>, and an output driver 510 that outputs a signal to be transmitted via the pad DQ<x>. The output driver 510 includes a pull-up circuit 511P and a pull-down circuit 511N.

The pull-up circuit 511P is configured with P-channel MOS transistors MP0 to MP4 (hereinafter, these transistors MP0 to MP4 will be representatively referred to as a transistor MP when there is no need to distinguish between them). The pull-down circuit 511N is configured with N-channel MOS transistors MN0 to MN4 (hereinafter, these transistors MN0 to MN4 will be representatively referred to as a transistor MN when there is no need to distinguish between them). The number of transistors MP and MN that are turned on may be appropriately set according to impedance control signals PCODEB and NCODEB, which will be described later. It should be noted that the pull-up circuit 511P may not necessarily be configured with P-channel MOS transistors, and the pull-down circuit 511N may not necessarily be configured with N-channel MOS transistors.

A voltage VCCQ is applied to a power supply terminal, and a voltage VSS is applied to a reference potential point. It should be noted that an external power supply may be supplied to the power supply terminal. Source-drain paths of a plurality of transistors MP and drain-source paths of a plurality of transistors MN are connected between the power supply terminal and the reference potential point. A connection point between the drain of the transistor MP and the drain of the transistor MN is connected to the pad DQ<x>.

The transistors MP each have a source connected to the power supply terminal, and a drain connected to the pad DQ<x>. That is, the source-drain paths of each transistor MP are connected in parallel. Control signals P0 to P4 are supplied to the respective gates of the transistors MP. The transistors MN each have a source connected to the reference potential point, and a drain connected to the pad DQ<x>. That is, the drain-source paths of each transistor MN are connected in parallel. Control signals N0 to N4 are supplied to the respective gates of the transistors MN.

The transistors MP and MN of the pull-up circuit 511P and the pull-down circuit 511N are controlled by the Ron setting circuit 610. That is, the Ron setting circuit 610 applies the control signals P0 to P4 (hereinafter, these control signals P0 to P4 will be referred to as a control signal P when not distinguished from each other) and the control signals N0 to N4 (hereinafter, these control signals N0 to N4 will be referred to as a control signal N when not distinguished from each other) corresponding to transmission data to the respective gates of the transistors MP0 to MP4 and MN0 to MN4. One or more of the transistors MP0 to MP4 are turned on by the control signals P and N, and the transistor MN is turned off, so that the pad DQ<x> becomes high level (hereinafter referred to as H level). In addition, the transistor MP is turned off by the control signals P and N, and one or more of the transistors MN0 to MN4 are turned on, so that the pad DQ<x> becomes low level (hereinafter referred to as L level). Data corresponding to the control signals P and N are transmitted from the pad DQ<x>.

The resistance value of the output driver 510 is determined according to which of the transistors MP and MN is turned on (activated). The resistance value (on-resistance) of the transistor can be changed by setting the gate length, the gate width, and the like. For example, by setting resistance values of the transistors MP and MN to mutually different values, such as weighting powers of 2, it is possible to finely adjust the resistance values over a wide range with a small number of transistors. By controlling the transistors to be turned on (activated) by the control signals P and N, ZQ calibration for adjusting an on-resistance Ron of the output driver 510 is possible.

As shown in FIG. 5, the Ron setting circuit 610 includes a PMOS-side Ron setting circuit 611P, an NMOS-side Ron setting circuit 611N, and NAND circuits 620 to 624, 630 to 634, 640 to 644, and 650 to 654.

Impedance control signals PCODEB<0> to PCODEB<4> (hereinafter, these impedance control signals PCODEB<0> to PCODEB<4> will be representatively referred to as an impedance control signal PCODEB) are input to first input terminals of the NAND circuits 630 to 634, respectively.

In addition, a pull-up signal DOP is input to second input terminals of the NAND circuits 620 to 624. The NAND circuits 620 to 624 invert the pull-up signal DOP and output the inverted signal to first input terminals of the NAND circuits 630 to 634, respectively. Each of the NAND circuits 620 to 624 may be provided as an inverter circuit. The impedance control signals PCODEB<0> to PCODEB<4> are input to second input terminals of the NAND circuits 630 to 634, respectively, and the NAND circuits 630 to 634 perform two-input NAND operations and apply the operation results as the control signals P0 to P4 to the gates of transistors MP0 to MP4, respectively.

Impedance control signals NCODEB<0> to NCODEB<4> are input to first input terminals of the NAND circuits 640 to 644, respectively. In addition, a pull-down signal DON is input to second input terminals of the NAND circuits 640 to 644. The NAND circuits 640 to 644 output the results of NAND operations between the impedance control signals NCODEB<0> to NCODEB<4> and the pull-down signal DON to the NAND circuits 650 to 654, respectively. The NAND circuits 650 to 654 invert the outputs of the NAND circuits 640 to 644, respectively. Each of the NAND circuits 650 to 654 may be provided as an inverter circuit. The outputs of the NAND circuits 650 to 654 are supplied to the gates of the transistors MN0 to MN4 as the control signals N0 to N4, respectively.

When the impedance control signal PCODEB< > is at L level, the output of the corresponding NAND circuits (one of NAND circuits 630 to 634) is at H level regardless of the polarity of the pull-up signal DOP. In such a case, the corresponding transistor MP is turned off. Also, when the impedance control signal PCODEB< > is at H level, the output of the corresponding NAND circuit (one of NAND circuits 630 to 634) is of the same polarity as the pull-up signal DOP. Therefore, in such a case, the control signal P corresponding to L level of the pull-up signal DOP becomes L level, and the transistor MP whose gate is supplied with the L level control signal P is turned on.

When the impedance control signal NCODEB< > is at L level, the output of the corresponding NAND circuit (one of NAND circuits 650 to 654) is at L level regardless of the polarity of the pull-down signal DON. In such a case, the transistor MN is turned off. Also, when the impedance control signal NCODEB< > is at H level, the output of the corresponding NAND circuit (one of NAND circuits 650 to 654) is of the same polarity as the pull-down signal DON. Therefore, in such a case, the control signal P corresponding to H level of the pull-down signal DON becomes H level, and the transistor MN whose gate is supplied with the H level control signal P is turned on.

Therefore, by setting the pull-up signal DOP to L level and the pull-down signal DON to L level, each transistor MP corresponding to the H level impedance control signal PCODEB is turned on, each transistor MN is turned off, and an H level output appears on the pad DQ<x>. In this case, the on-resistance Ron of the output driver 510 has a resistance value corresponding to the transistor MP turned on by the impedance control signal PCODEB.

Further, by setting the pull-up signal DOP to H level and the pull-down signal DON to H level, each transistor MP is turned off, each transistor MN corresponding to the H level impedance control signal NCODEB is turned on, and an L level output appears on the pad DQ<x>. In this case, the on-resistance Ron of the output driver 510 has a resistance value corresponding to the transistor MN turned on by the impedance control signal NCODEB.

A signal FLG2 is supplied to the PMOS-side Ron setting circuit 611P and the NMOS-side Ron setting circuit 611N during ZQ calibration. The PMOS-side Ron setting circuit 611P and the NMOS-side Ron setting circuit 611N apply the impedance control signals PCODEB and NCODEB to the NAND circuits 630 to 634 and 640 to 644, respectively, and change the impedance control signals PCODEB and NCODEB according to the value of the signal FLG2, as will be described later, thereby obtaining the impedance control signals PCODEB and NCODEB that will generate the on-resistance Ron that is closest to a predetermined value.

The PMOS-side Ron setting circuit 611P has a register 612P. For example, the PMOS-side Ron setting circuit 611P provides the impedance control signal PCODEB to the NAND circuits 630 to 634 in an iterative manner, and causes the register 612P to store the impedance control signal PCODEB when the signal FLG2 is inverted. The PMOS-side Ron setting circuit 611P outputs the impedance control signal PCODEB stored in the register 612P to the NAND circuits 630 to 634.

In addition, the NMOS-side Ron setting circuit 611N has a register 612N. For example, the NMOS-side Ron setting circuit 611N provides the impedance control signal NCODE to the NAND circuits 640 to 644 in an iterative manner, and causes the register 612N to store the impedance control signal NCODEB when the signal FLG2 is inverted. The NMOS-side Ron setting circuit 611N outputs the impedance control signal NCODEB stored in the register 612N to the NAND circuits 640 to 644.

In this way, the on-resistance Ron of the output driver 510 is set by determining the impedance control signals PCODEB and NCODEB based on the signal FLG2. As will be described later, the control circuit 60 simultaneously instructs the Ron setting circuit 610 of each OCD circuit 50 to adjust the on-resistance Ron. Thus, each OCD circuit 50 performs ZQ calibration by the Ron setting circuit 610 independently of each other and simultaneously.

In the present embodiment, each OCD circuit 50 is provided with a resistor circuit 500 in order to obtain the signal FLG2 for individually controlling the on-resistance Ron of each OCD circuit 50.

One end of the resistor circuit 500 functioning as a reference resistor is connected to the power supply terminal that supplies the voltage VCCQ, and the other end (node PT) of the resistor circuit 500 is connected to the pad ZQ via the switches 503 and 52. The switch 503 and a switch 504 to be described later are controlled to be turned on and off by the control circuit 60. The resistance value of the resistor circuit 500 is variable according to the control signal from the reference resistance setting circuit 613 of the control circuit 60. For example, the resistor circuit 500 may be configured with a plurality of transistors whose drain-source paths are connected in parallel.

Figure 6:
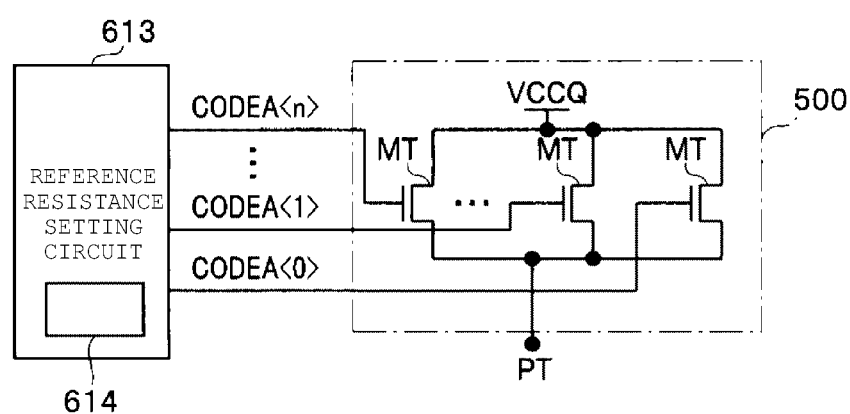
FIG. 6 is a circuit diagram showing an example of a specific configuration of a resistor circuit.

FIG. 6 is a circuit diagram showing an example of a specific configuration of the resistor circuit 500.

The resistor circuit 500 may be configured with a plurality of NMOS transistors MT. The drain of each transistor MT is commonly connected to the power supply terminal. In addition, the source of each transistor MT can be connected to the node PT. Impedance control signals CODEA<0> to CODEA<n> (n is an integer equal to or greater than 1) are supplied from the reference resistance setting circuit 613 to the gates of the respective transistors MT.

The transistor MT is turned on by the H-level impedance control signals CODEA<0> to CODEA<n> (hereinafter, these impedance control signals CODEA<0> to CODEA<n> will be representatively referred to as an impedance control signal CODEA), and the resistance value (hereinafter also referred to as a reference resistor for each pad) of the resistor circuit 500 is determined by the on-resistance of the turned-on transistor.

The reference resistance setting circuit 613 has a nonvolatile register 614, and the reference resistance setting circuit 613 stores an adjustment value for setting the resistance value of the resistor circuit 500 in the register 614. Each OCD circuit 50 has a resistor circuit 500, and the register 614 stores an adjustment value for each resistor circuit 500 of each OCD circuit 50.

In some cases, a current path between the resistor circuit 500 and the node PT is disconnected. When the resistor circuit 500 is configured with the transistors MT shown in FIG. 6, the current path between the resistor circuit 500 and the node PT can be disconnected by turning off all the transistors MT.

In FIG. 5, the node PT is connected to the pad DQ<x> via the switch 504 and is also connected to a VREF supply circuit 502. The VREF supply circuit 502 supplies a voltage VREF to one input terminal of an input receiver IREC. The input receiver IREC has the other input terminal connected to the pad DQ<x>. The input receiver IREC functions, for example, as a buffer, compares the signal input via the pad DQ<x> with the voltage VREF from the VREF supply circuit 502 to determine the logic of the input signal, converts the input signal, for example, to the proper voltage level for processing in the nonvolatile memory 2, and transfers it to other circuits in the nonvolatile memory 2.

In the present embodiment, the VREF supply circuit 502 also supplies the voltage VREF to one input terminal of the comparator 501. The voltage of the node PT is applied to the other input terminal of the comparator 501. The comparator 501 outputs a signal FLG2 whose level corresponds to the difference between two inputs. A destination of the voltage VREF supplied from the VREF supply circuit 502 is controlled by the control circuit 60. The determination circuit 600 is configured with the comparator 501, the VREF supply circuit 502 and the switch 503.

Figure 7:
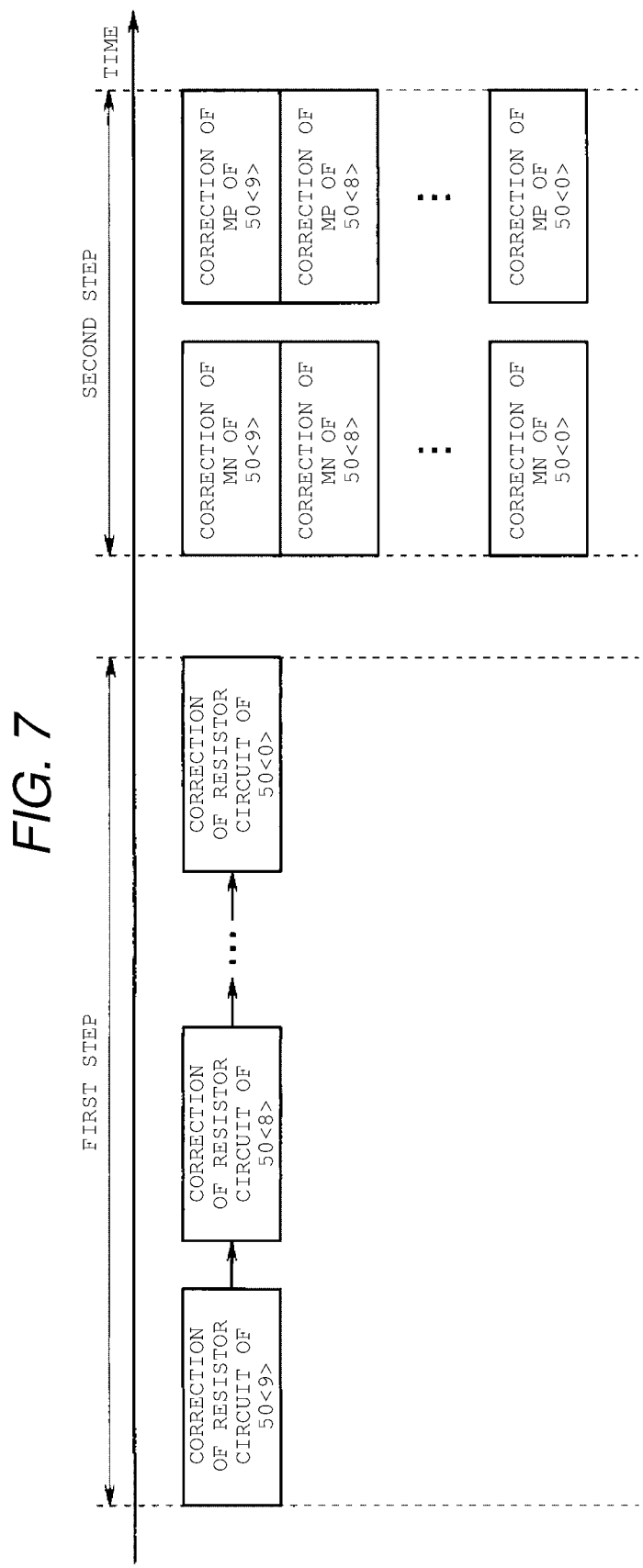
FIG. 7 is an explanatory diagram showing a flow of ZQ calibration.
Figure 8:
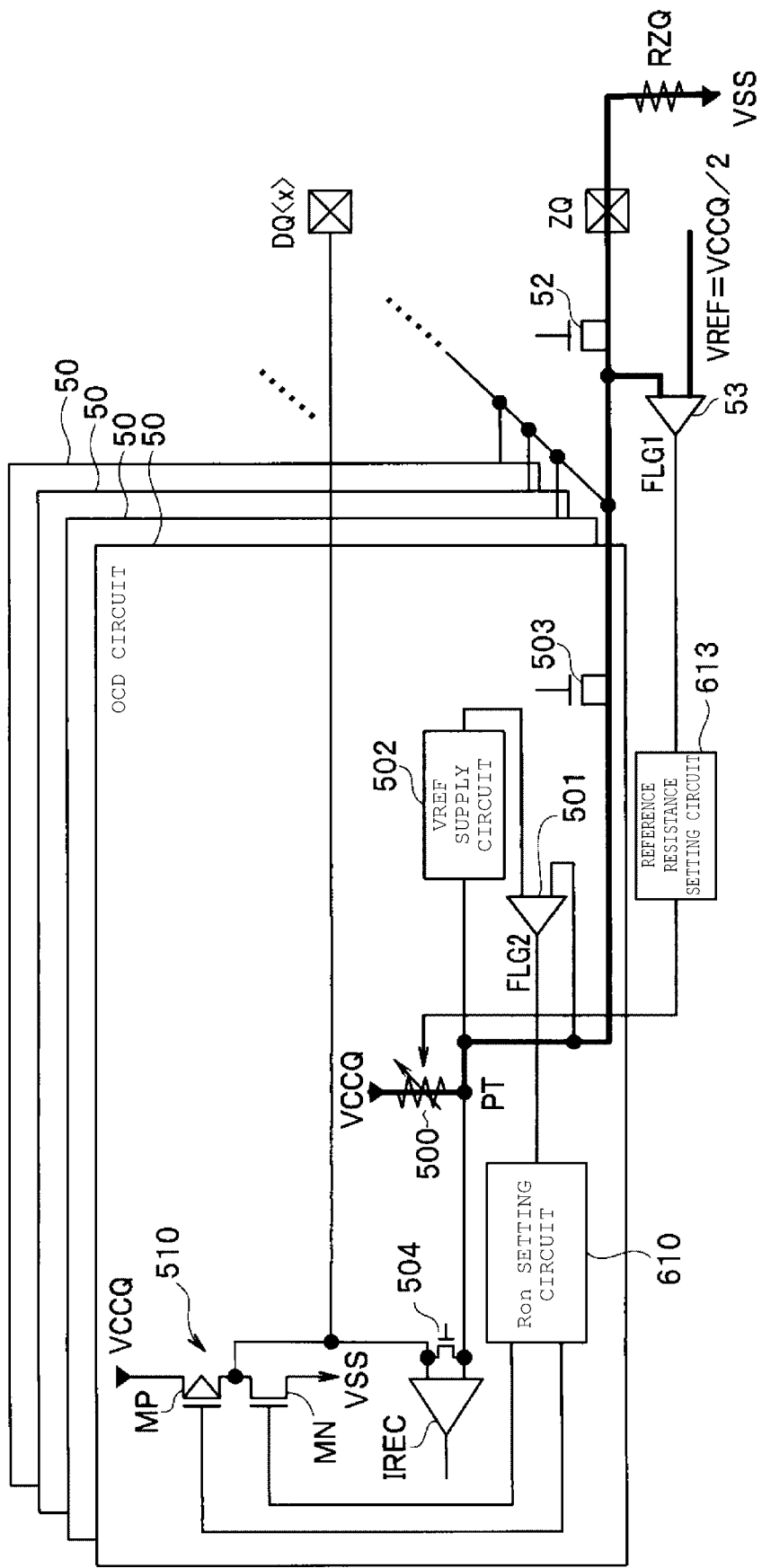
FIG. 8 is a circuit diagram illustrating a first step of an operation of the embodiment.
Figure 9:
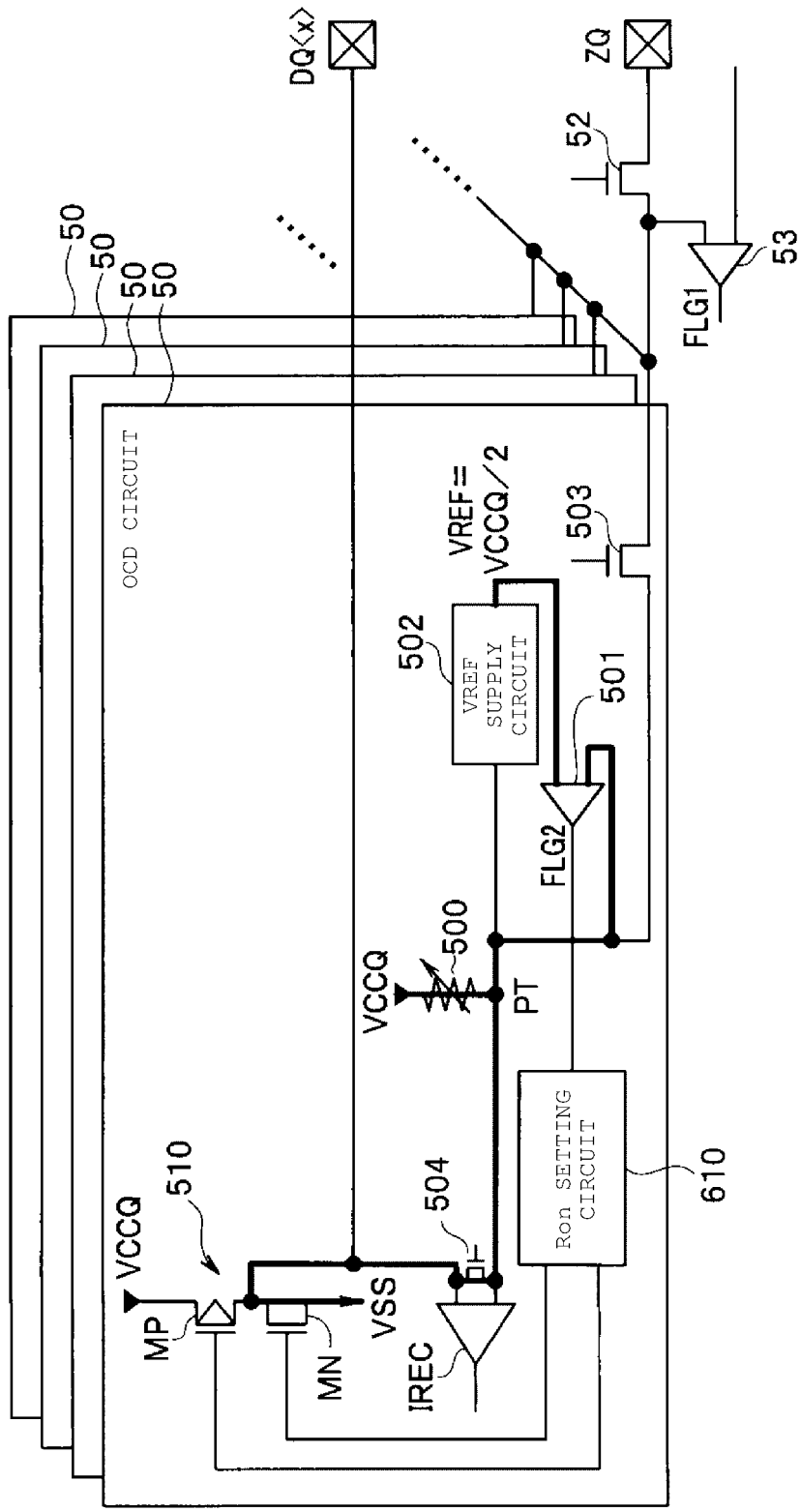
FIGS. 9-10 are circuit diagrams illustrating a second step of the operation of the embodiment.
Figure 10:
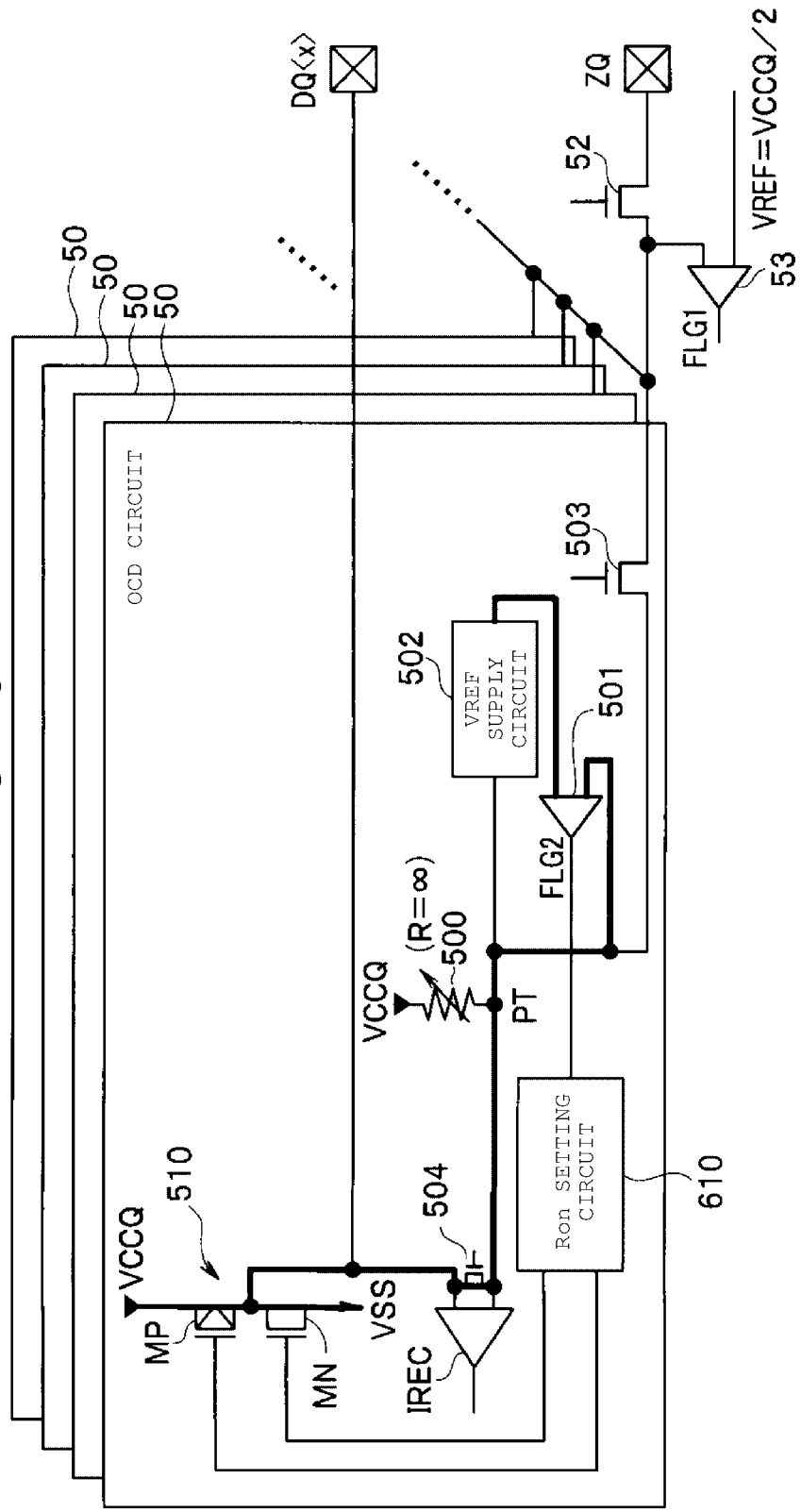

Next, the operation of the embodiment configured in this manner will be described with reference to FIGS. 7 to 10. FIG. 7 is an explanatory diagram showing a flow of ZQ calibration processing, and FIGS. 8 to 10 are circuit diagrams illustrating the operation of the embodiment. In FIGS. 8 to 10, the same elements as in FIGS. 3 and 5 are denoted by the same reference numerals. FIGS. 8 to 10 show a simplified configuration of the OCD circuit 50 of FIG. 5.

ZQ calibration in the present embodiment includes a first step of setting the resistance value (reference resistor for each pad) of the resistor circuit 500 in the OCD circuit 50 connected to each pad DQ<x>, and a second step of adjusting the on-resistance Ron of the output driver 510 using the resistor circuit 500. FIG. 8 illustrates the first step, and FIGS. 9 and 10 illustrate the second step.

As shown in FIG. 7, the first step of the ZQ calibration is to sequentially correct the resistor circuit 500 of each OCD circuit 50 to a prescribed resistance value. FIG. 8 shows a connection state in the first step with a thick line. In the first step, a reference resistor RZQ is connected between the pad ZQ and an external reference potential point. In addition, the control circuit 60 turns off the switch 504, turns on the switches 52 and 503, and sets the resistance value of the resistor circuit 500 to an initial value.

Since the switches 52 and 503 are turned on, the pad ZQ and the node PT are electrically connected to each other. Accordingly, a current flows from the power supply terminal to the external reference potential point via the resistor circuit 500, the node PT, the switch 503, the switch 52, the pad ZQ, and the reference resistor RZQ. The voltage of the node PT is determined by the resistance value of the resistor circuit 500 and the resistance value of the reference resistor RZQ. Assuming that the voltage VCCQ is applied to the power supply terminal and that the resistance value of the resistor circuit 500 matches the resistance value of the reference resistor RZQ, the voltage of the node PT becomes VCCQ/2. The comparator 53 compares the voltage of the node PT and the voltage VREF (for example, VCCQ/2) and outputs the difference between the two inputs to the control circuit 60 as the signal FLG1.

When the resistance value of the resistor circuit 500 is greater than the resistance value of the reference resistor RZQ, the voltage of the node PT becomes lower than the voltage VREF, and when the resistance value of the resistor circuit 500 is smaller than the resistance value of the reference resistor RZQ, the voltage of the node PT becomes higher than the voltage VREF. For example, the comparator 53 outputs a negative signal FLG1 when the resistance value of the resistor circuit 500 is greater than the resistance value of the reference resistor RZQ, and the comparator 53 outputs a positive signal FLG1 when the resistance value of the resistor circuit 500 is less than the resistance value of the reference resistor RZQ. The reference resistance setting circuit 613 of the control circuit 60 continually changes the resistance value of the resistor circuit 500 based on the signal FLG1 which is also continually changing, to try to match the resistance value of the resistor circuit 500 with the resistance value of the reference resistor RZQ, until the signal FLG1 converges to a predetermined value. Depending on the resolution of the resistance value of the resistor circuit 500, the resistance value of the resistor circuit 500 may not be able to be completely match the resistance value of the reference resistor RZQ. In this case, the resistance value of the resistor circuit 500 is set to the resistance value closest to the resistance value of the reference resistor RZQ. Also in the following description, it is assumed that the term "matching the resistance values" includes such a case where the resistance value of the resistor circuit 500 is set to the resistance value closest to the resistance value of the reference resistor RZQ. The reference resistance setting circuit 613 stores in the register 614 an adjustment value (impedance control signal CODEA) which is set based on the FLG1 corresponding to when the resistance value of the resistor circuit 500 matches the resistance value of the reference resistor RZQ.

The control circuit 60 turns on the switch 503 to correct the resistance value of the resistor circuit 500 in the OCD circuit 50. By sequentially switching the OCD circuits 50 whose switch 503 is turned on by the control circuit 60, as shown in FIG. 7, adjustment values for matching the resistance value of the resistor circuit 500 of each OCD circuit 50 with the resistance value of the reference resistor RZQ are sequentially obtained, and stored in the register 614.

Such a first step may be performed during cell evaluation prior to shipment from the factory, for example. Meanwhile, the second step may be performed at a predetermined timing after shipment from the factory, for example. In the present embodiment, the first step uses the reference resistor RZQ, but the second step uses the resistor circuit 500, and thus the reference resistor RZQ is unnecessary. Therefore, there is no need to prepare the reference resistor RZQ for ZQ calibration after shipment, for example.

In the second step, the adjustment of the on-resistance Ron of the transistor MN in the output driver 510 and the adjustment of the on-resistance Ron of the transistor MP are performed separately. First, the adjustment of the on-resistance Ron of the transistor MN is performed. In FIG. 9, the thick line indicates a connection state when the on-resistance Ron of the transistor MN is adjusted in the second step. In this case, the control circuit 60 sets the adjustment value (impedance control signal CODEA) obtained in the first step to the resistor circuit 500 to match the resistance value of the resistor circuit 500 with the resistance value of the reference resistor RZQ. In addition, the control circuit 60 turns off the switch 503 and turns on the switch 504. Also, the control circuit 60 controls the Ron setting circuit 610 to set the resistance value of the transistor MN to an initial value and turn off the transistor MP. The control circuit 60 also supplies the voltage VREF from the VREF supply circuit 502 to the comparator 501.

Since the switch 504 is turned on, the node PT and the drain of the transistor MN are electrically connected to each other. Accordingly, a current flows from the power supply terminal to the internal reference potential point via the current path of the resistor circuit 500, the node PT, the switch 504, and the transistor MN turned on by the initial setting. The voltage of the node PT is determined by the resistance value of the resistor circuit 500 and the resistance value of the on-resistance Ron of the transistor MN. Assuming that the voltage VCCQ is applied to the power supply terminal and that the on-resistance Ron of the transistor MN matches the resistance value of the resistor circuit 500, the voltage of the node PT becomes VCCQ/2. The comparator 501 compares the voltage of the node PT and the voltage VREF (=VCCQ/2) and outputs the difference between the two inputs to the Ron setting circuit 610 as the signal FLG2.

When the resistance value of the resistor circuit 500 is greater than the resistance value of the on-resistance Ron of the transistor MN, the voltage of the node PT becomes lower than the voltage VREF, and when the resistance value of the resistor circuit 500 is smaller than the resistance value of the on-resistance Ron of the transistor MN, the voltage of the node PT becomes higher than the voltage VREF. For example, the comparator 501 outputs a negative signal FLG2 when the resistance value of the resistor circuit 500 is greater than the resistance value of the on-resistance Ron of the transistor MN, and the comparator 501 outputs a positive signal FLG2 when the resistance value of the resistor circuit 500 is less than the resistance value of the on-resistance Ron of the transistor MN. The NMOS-side Ron setting circuit 611N of the Ron setting circuit 610 continually changes the resistance value of the on-resistance Ron of the transistor MN based on the signal FLG2 which is also continually changing, to try to match the resistance value of the on-resistance Ron of the transistor MN with the resistance value of the resistor circuit 500, until the signal FLG2 converges to a predetermined value. The NMOS-side Ron setting circuit 611N of the Ron setting circuit 610 stores in the register 612N an adjustment value when the resistance value of the on-resistance Ron of the transistor MN matches the resistance value of the resistor circuit 500.

Each OCD circuit 50 is provided with a resistor circuit 500 whose resistance value is adjusted using a reference resistor RZQ, and adjustment of the on-resistance Ron of the transistor MN can be performed simultaneously in all the OCD circuits 50, as shown in FIG. 7.

Next, the adjustment of the on-resistance Ron of the transistor MP is performed. In FIG. 10, the thick line indicates a connection state when the on-resistance Ron of the transistor MP is adjusted in the second step. In this case, the control circuit 60 turns off the switch 503 and turns on the switch 504 to cut off the current path between the resistor circuit 500 and the node PT. For example, the control circuit 60 can cut off the current path between the resistor circuit 500 and the node PT by turning off all the transistors that configure the resistor circuit 500. The control circuit 60 applies the voltage VREF from the VREF supply circuit 502 to the comparator 501.

The NMOS-side Ron setting circuit 611N of the Ron setting circuit 610 outputs the impedance control signal NCODEB based on the adjustment value stored in the register 612N. Based on the impedance control signal NCODEB, a control signal N is applied to each transistor MN to set the on-resistance Ron of the pull-down circuit 511N. In this state, the control circuit 60 controls the Ron setting circuit 610 to set the resistance value of the transistor MP to an initial value.

Some of the transistors MN based on the control signal N and some of the transistors MP based on the initial settings are turned on, and a current path is established between the power supply terminal and the reference potential point via the transistors MP and MN that are turned on. Accordingly, a current flows from the power supply terminal to the reference potential point via the turned-on transistor MP and the turned-on transistor MN.

The voltage of the node PT is determined by the resistance value of the on-resistance Ron of the transistor MN and the resistance value of the on-resistance Ron of the transistor MP. Assuming that the voltage VCCQ is applied to the power supply terminal and that the on-resistance Ron of the transistor MN matches the resistance value of the on-resistance Ron of the transistor MP, the voltage of the node PT becomes VCCQ/2. The comparator 501 compares the voltage of the node PT and the voltage VREF (=VCCQ/2) and outputs the difference between the two inputs to the Ron setting circuit 610 as the signal FLG2.

When the resistance value of the on-resistance Ron of the transistor MP is greater than the resistance value of the on-resistance Ron of the transistor MN, the voltage of the node PT becomes lower than the voltage VREF, and when the resistance value of the on-resistance Ron of the transistor MP is smaller than the resistance value of the on-resistance Ron of the transistor MN, the voltage of the node PT becomes higher than the voltage VREF. The PMOS-side Ron setting circuit 611P of the Ron setting circuit 610 continually changes the resistance value of the on-resistance Ron of the transistor MP based on the signal FLG2 which is also continually changing, to try to match the resistance value of the on-resistance Ron of the transistor MP with the resistance value of the on-resistance Ron of the transistor MN, until the signal FLG2 converges to a predetermined value. The PMOS-side Ron setting circuit 611P stores in the register 612P an adjustment value when the resistance value of the on-resistance Ron of the transistor MP matches the resistance value of the on-resistance Ron of the transistor MN.

This adjustment of the on-resistance Ron of the transistor MP can also be performed simultaneously in all the OCD circuits 50, as shown in FIG. 7. Thereafter, in actual use, the PMOS-side Ron setting circuit 611P provides the NAND circuits 620 to 624 with the impedance control signal PCODEB based on the adjustment value stored in the register 612P, and the NMOS-side Ron setting circuit 611N provides the NAND circuits 640 to 644 with the impedance control signal NCODEB based on the adjustment value stored in the register 612N. Thus, ZQ calibration using the resistor circuit 500 can be performed in each OCD circuit 50, and variations in output characteristics between the OCD circuits 50 can be reduced.

In this way, in the present embodiment, a reference resistor for ZQ calibration is provided for each OCD circuit connected to each DQ pad, and it is thus possible to allow ZQ calibration for each output driver connected to all DQ pads to be performed simultaneously. Accordingly, it is possible to shorten the time required for performing ZQ calibration.

Also, in the present embodiment, the voltage VREF used for ZQ calibration can be separately set for each OCD circuit connected to each DQ pad. In the above description, an example in which the on-resistance Ron of the transistor MN and the on-resistance Ron of the transistor MP are matched has been described. However, by adjusting the voltage VREF, it is possible to set the on-resistance Ron of the transistor MN and the on-resistance Ron of the transistor MP to be different values. In this case, the present embodiment has an advantage that the ratio between the on-resistance Ron of the transistor MN and the on-resistance Ron of the transistor MP can be individually set for each OCD circuit.

Further, in the above description, an example in which the resistance value of the resistor circuit 500 is matched with the resistance value of the reference resistor RZQ, the resistance value of the transistor MN is matched with the resistance value of the resistor circuit 500, and the resistance value of the transistor MP is matched with the resistance value of the transistor MN has been described. However, when the resistance value of the reference resistor RZQ is relatively large, fine adjustment of the on-resistance Ron may be difficult depending on the resolution of the transistors MN and MP. Therefore, the Ron setting circuit 610 may obtain an adjustment value that matches the resistance value of the transistor MN with the resistance value of the resistor circuit 500, and then store the adjustment value in the register 612N after changing the adjustment value by calculation so as to decrease the resistance value of the transistor MN. For example, when the reference resistor RZQ is 300Ω, adjustment such as setting the on-resistance Ron of the transistor MN to 100Ω can be considered. This makes it possible to more finely adjust the on-resistances Ron of the transistors MN and MP.

Second Embodiment

Figure 11:
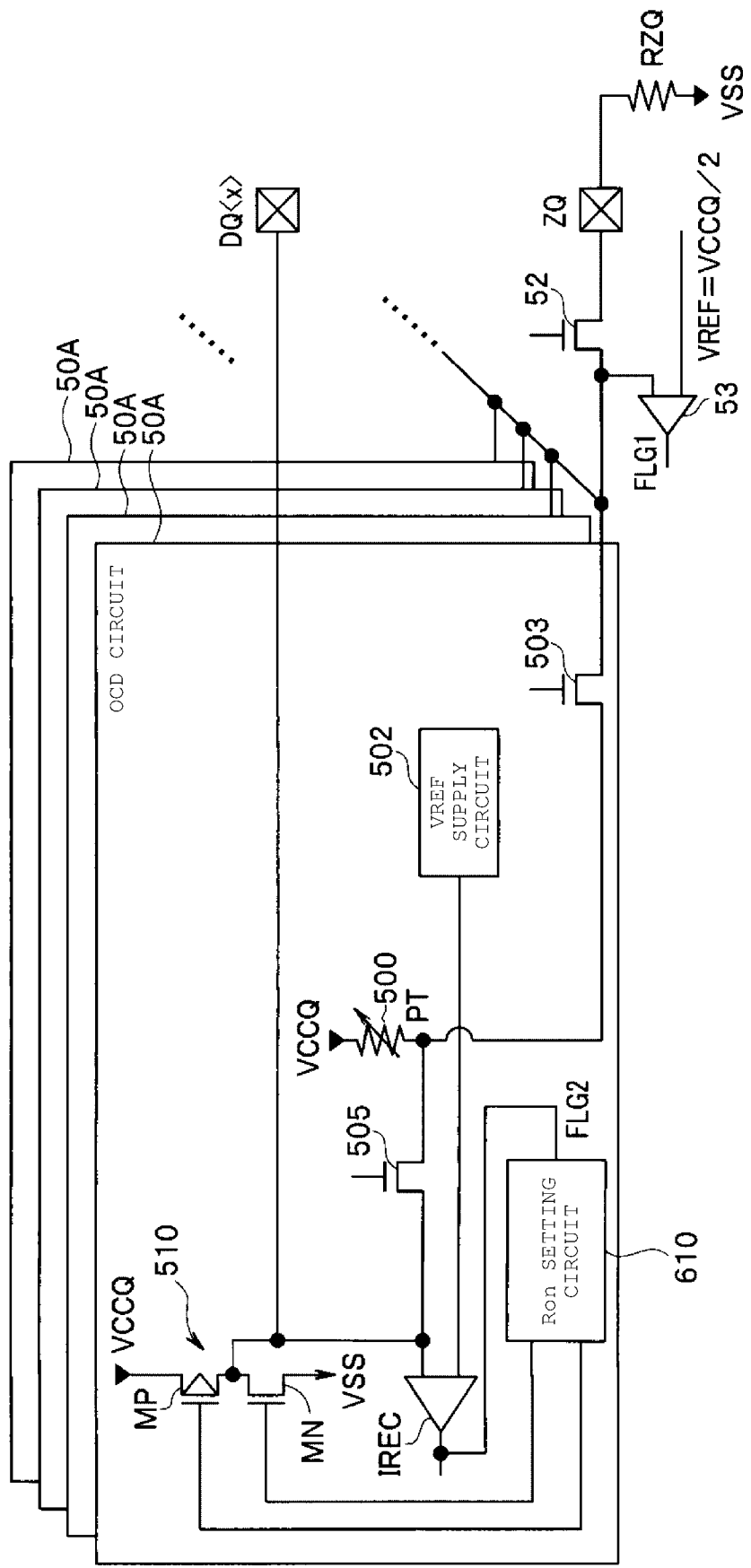
FIG. 11 is a circuit diagram showing a second embodiment.

FIG. 11 is a circuit diagram showing a second embodiment. In FIG. 11, the same elements as in FIG. 8 are denoted by the same reference numerals, and descriptions thereof will be omitted. The present embodiment employs an OCD circuit 50A instead of the OCD circuit 50. The OCD circuit 50A according to the present embodiment is obtained by omitting the comparator 501 and the switch 504 from the OCD circuit 50. The comparator 501 is supplied with the voltage VREF from the VREF supply circuit 502 and compares the voltage of the node PT with the voltage VREF. In the present embodiment, the voltage of the node PT and the voltage VREF are compared by using the input receiver IREC which determines the logic of the input signal from the pad DQ<x> using the voltage VREF.

The voltage VREF from the VREF supply circuit 502 is supplied to one input terminal of the input receiver IREC. In the present embodiment, the other input terminal of the input receiver IREC is connected to the node PT via a switch 505. The node PT is also connected to the pad ZQ via the switches 503 and 52.

Operations

Similarly to the first embodiment, ZQ calibration of the embodiment configured as described above also includes a first step of setting the resistance value of the resistor circuit 500 in the OCD circuit 50A connected to each pad DQ<x>, and a second step of adjusting the on-resistance Ron of the output driver 510 using the resistor circuit 500. That is, also in the present embodiment, the same processing as in FIG. 7 is performed.

In the first step of the ZQ calibration, the resistor circuit 500 of each OCD circuit 50A is sequentially corrected to a prescribed resistance value. In the first step, a reference resistor RZQ is connected between the pad ZQ and a reference potential point. In addition, the control circuit 60 turns off the switch 505, turns on the switches 52 and 503, and sets the resistance value of the resistor circuit 500 to an initial value.

Since the switches 52 and 503 are turned on, the pad ZQ and the node PT are electrically connected to each other. Accordingly, a current flows from the power supply terminal to the reference potential point via the resistor circuit 500, the node PT, the switch 503, the switch 52, the pad ZQ, and the reference resistor RZQ. The comparator 53 compares the voltage of the node PT and the voltage VREF (=VCCQ/2) and outputs the difference between the two inputs to the control circuit 60 as the signal FLG1.

The reference resistance setting circuit 613 of the control circuit 60 continually changes the resistance value of the resistor circuit 500 based on the signal FLG1 which is also continually changing, to try to match the resistance value of the resistor circuit 500 with the resistance value of the reference resistor RZQ, until the signal FLG1 converges to a predetermined value. The reference resistance setting circuit 613 stores an adjustment value in the register 614 when the resistance value of the resistor circuit 500 matches the resistance value of the reference resistor RZQ.

The switch 503 is turned on by the control circuit 60, and the resistance value of the resistor circuit 500 in the OCD circuit 50A is corrected. By sequentially switching the OCD circuits 50A whose switch 503 is turned on by the control circuit 60, as shown in FIG. 7, adjustment values for matching the resistance value of the resistor circuit 500 of each OCD circuit 50A with the resistance value of the reference resistor RZQ are sequentially obtained, and stored in the register 614.

In the second step, the adjustment of the on-resistance Ron of the transistor MN in the output driver 510 and the adjustment of the on-resistance Ron of the transistor MP are performed separately. First, the adjustment of the on-resistance Ron of the transistor MN is performed. That is, the control circuit 60 sets the adjustment value obtained in the first step to the resistor circuit 500 to match the resistance value of the resistor circuit 500 with the resistance value of the reference resistor RZQ. The control circuit 60 turns off the switch 503 and turns on the switch 505 to apply the voltage VREF from the VREF supply circuit 502 to the input receiver IREC. The Ron setting circuit 610 is controlled by the control circuit 60 to set the resistance value of the transistor MN to an initial value and turn off the transistor MP.

Since the switch 505 is turned on, the node PT and the drain of the transistor MN are electrically connected to each other. Accordingly, a current flows from the power supply terminal to the reference potential point via the current path of the resistor circuit 500, the node PT, the switch 505, and the transistor MN turned on by the initial setting. The input receiver IREC is supplied with the voltage of the node PT and the voltage VREF from the VREF supply circuit 502. The input receiver IREC compares the voltage of the node PT and the voltage VREF (=VCCQ/2) and outputs the difference between the two inputs to the Ron setting circuit 610 as the signal FLG2.

The NMOS-side Ron setting circuit 611N of the Ron setting circuit 610 continually changes the resistance value of the on-resistance Ron of the transistor MN based on the signal FLG2 which is also continually changing, to try to match the resistance value of the on-resistance Ron of the transistor MN with the resistance value of the resistor circuit 500, until the signal FLG2 converges to a predetermined value. The NMOS-side Ron setting circuit 611N stores an adjustment value in the register 612N when the resistance value of the on-resistance Ron of the transistor MN matches the resistance value of the resistor circuit 500.

Each OCD circuit 50A is provided with a resistor circuit 500 whose resistance value is adjusted using a reference resistor RZQ, and adjustment of the on-resistance Ron of the transistor MN can be performed simultaneously in all the OCD circuits 50A, as shown in FIG. 7.

Next, the adjustment of the on-resistance Ron of the transistor MP is performed. In this case, the control circuit 60 turns off the switches 503 and 505 to cut off conduction between the node PT and the other input terminal of the input receiver IREC. The control circuit 60 applies the voltage VREF from the VREF supply circuit 502 to the input receiver IREC.

The NMOS-side Ron setting circuit 611N of the Ron setting circuit 610 outputs the impedance control signal NCODEB based on the adjustment value stored in the register 612N. Based on the impedance control signal NCODEB, a control signal N is applied to each transistor MN to set the on-resistance Ron of the pull-down circuit 511N. In this state, the Ron setting circuit 610 is controlled by the control circuit 60 to set the resistance value of the transistor MP to an initial value.

Some of the transistors MN based on the control signal N and some of the transistors MP based on the initial settings are turned on, and conduction is established between the power supply terminal and the reference potential point via the transistors MP and MN that are turned on. Accordingly, a current flows from the power supply terminal to the reference potential point via the turned-on transistor MP and the turned-on transistor MN.

The input receiver IREC compares the voltage of the drain of the transistor MN (the voltage of the source of the transistor MP) and the voltage VREF (=VCCQ/2) and outputs the difference between the two inputs to the Ron setting circuit 610 as the signal FLG2. The PMOS-side Ron setting circuit 611P of the Ron setting circuit 610 continually changes the resistance value of the on-resistance Ron of the transistor MP based on the signal FLG2 which is also continually changing, to try to match the resistance value of the on-resistance Ron of the transistor MP with the resistance value of the on-resistance Ron of the transistor MN, until the signal FLG2 converges to a predetermined value. The PMOS-side Ron setting circuit 611P stores an adjustment value in the register 612P when the resistance value of the on-resistance Ron of the transistor MP matches the resistance value of the on-resistance Ron of the transistor MN.

This adjustment of the on-resistance Ron of the transistor MP can also be performed simultaneously in all the OCD circuits 50A, as shown in FIG. 7. Thereafter, in actual use, the PMOS-side Ron setting circuit 611P provides the NAND circuits 620 to 624 with the impedance control signal PCODEB based on the adjustment value stored in the register 612P, and the NMOS-side Ron setting circuit 611N provides the NAND circuits 640 to 644 with the impedance control signal NCODEB based on the adjustment value stored in the register 612N. Thus, ZQ calibration using the resistor circuit 500 can be performed in each OCD circuit 50A, and variations in output characteristics between the OCD circuits 50A can be reduced.

In this way, the same effects as those of the first embodiment can be obtained in the present embodiment as well. Moreover, the present embodiment has an advantage that the circuit area can be reduced by omitting the comparator.

Third Embodiment

Figure 12:
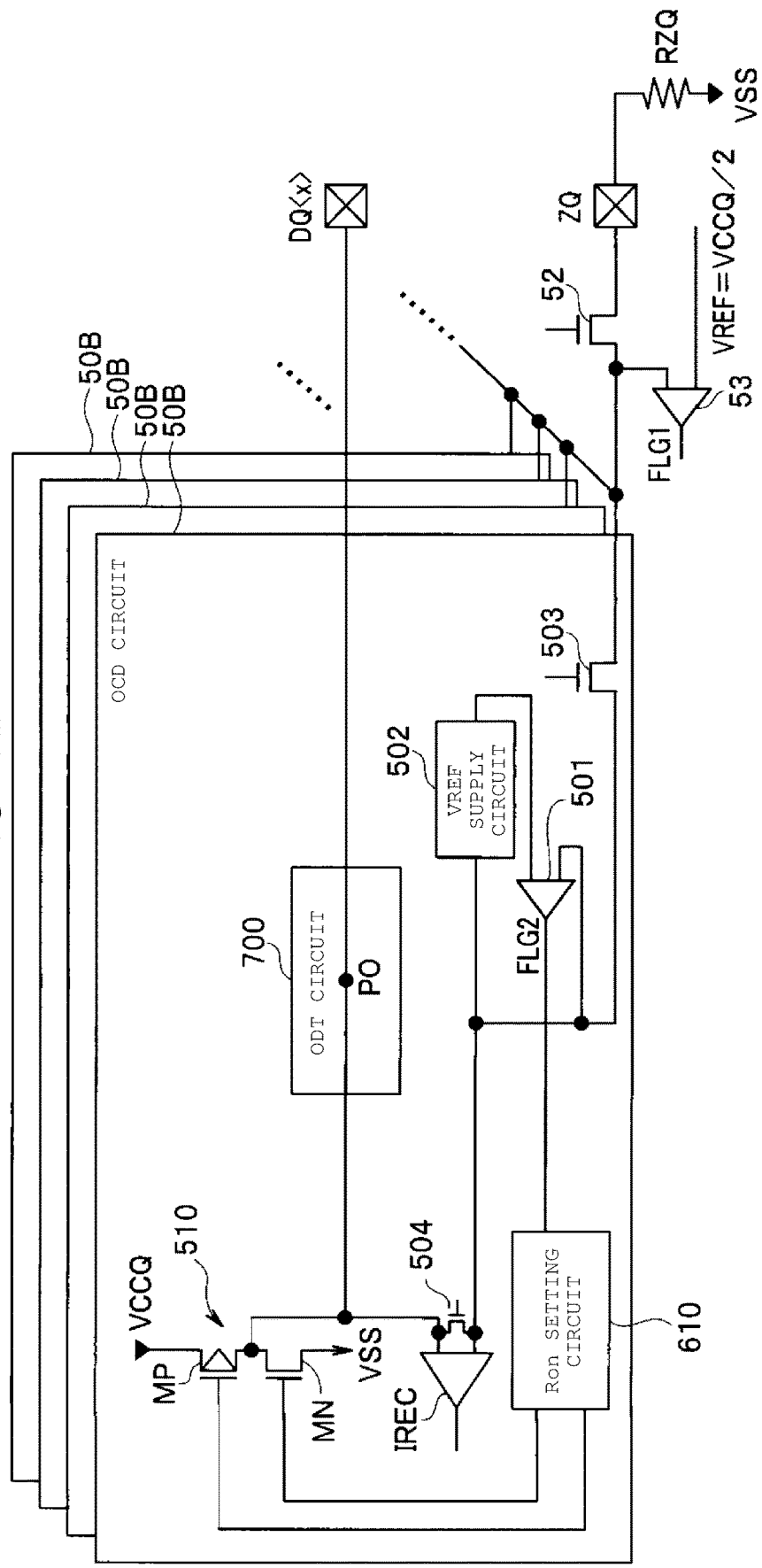
FIG. 12 is a circuit diagram showing a third embodiment.

FIG. 12 is a circuit diagram showing a third embodiment. In FIG. 12, the same elements as in FIG. 8 are denoted by the same reference numerals, and descriptions thereof will be omitted. The present embodiment employs an OCD circuit 50B instead of the OCD circuit 50. The OCD circuit 50B according to the present embodiment is obtained by omitting the resistor circuit 500 from the OCD circuit 50. An on-die termination (ODT) circuit functioning as a terminating resistor circuit may be connected to each pad DQ<x>. The present embodiment uses the resistance of this ODT circuit as a reference resistor for each pad. It should be noted that although the present embodiment is applied to the first embodiment, it is also applicable to the second embodiment.

An ODT circuit 700 is connected between the pad DQ<x> and the input receiver IREC and the output driver 510.

Figure 13:
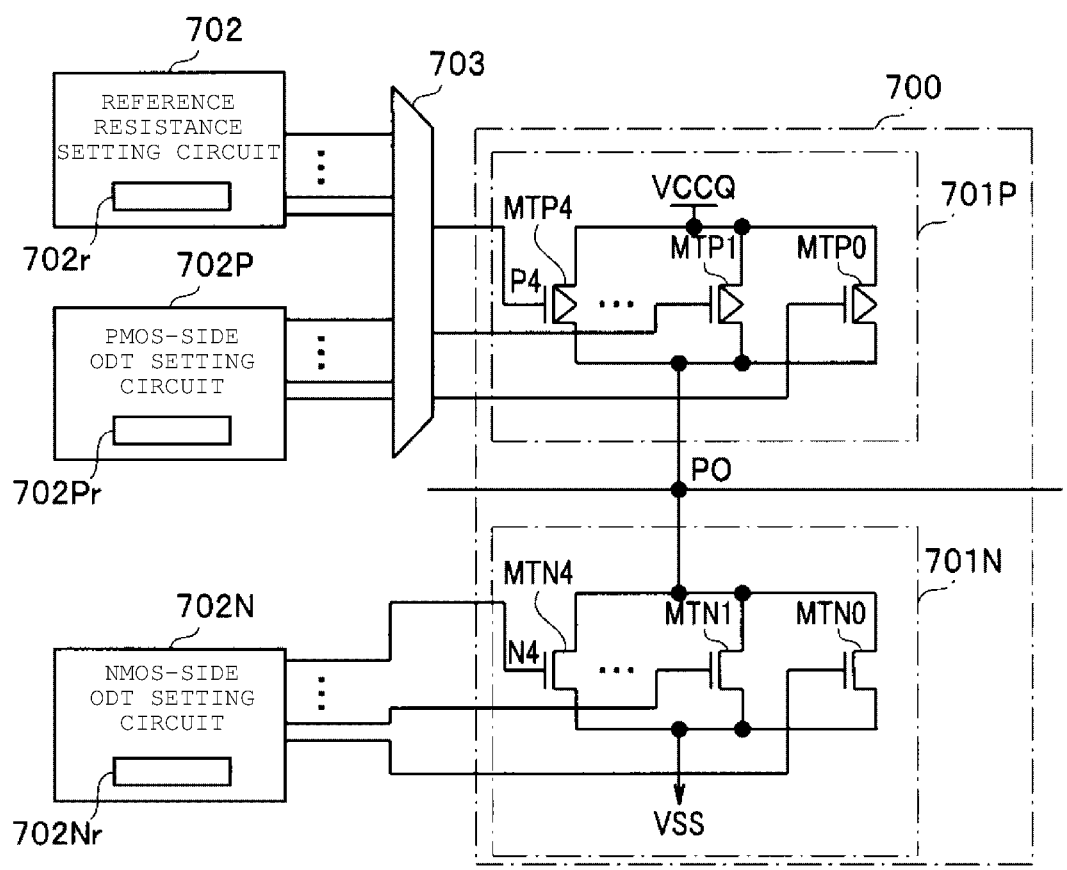
FIG. 13 is a circuit diagram showing an example of a specific configuration of an ODT circuit.

FIG. 13 is a circuit diagram showing an example of a specific configuration of the ODT circuit 700. The ODT circuit 700 includes a PMOS transistor group 701P and an NMOS transistor group 701N. The PMOS transistor group 701P is configured with P-channel MOS transistors MTP0 to MTPm (m is a natural number) (hereinafter, these transistors MTP0 to MTPm will be representatively referred to as a transistor MTP when there is no need to distinguish between them). The NMOS transistor group 701N is configured with N-channel MOS transistors MTN0 to MTNj (j is a natural number) (hereinafter, these transistors MTN0 to MTNj will be representatively referred to as a transistor MTN when there is no need to distinguish between them). The number of transistors MTP and MTN may be set as appropriate.

In the present embodiment, as will be described later, the transistor MTP is used as a reference resistor for each pad. Therefore, in order to set the resistance value with higher accuracy, a larger number of transistors than the transistor MTN may be included.

A voltage VCCQ is applied to the power supply terminal, and the source-drain paths of a plurality of transistors MTP and drain-source paths of a plurality of N-channel MOS transistors MTN are connected between the power supply terminal and the reference potential point. A connection point between the drain of the transistor MTP and the drain of the transistor MTN (hereinafter referred to as a node PO) is connected to the pad DQ<x> and a connection point between the drain of the transistor MP and the drain of the transistor MN of the output driver 510.

The transistor MTP has a source connected to the power supply terminal and a drain connected to the node PO. That is, the source-drain paths of each transistor MTP are connected in parallel. Control signals are supplied to the respective gates of the transistors MTP. The transistor MTN has a source connected to the reference potential point, and a drain connected to the node PO. That is, the drain-source paths of each transistor MTN are connected in parallel. Control signals are supplied to the respective gates of the transistors MTN.

A PMOS-side ODT setting circuit 702P, an NMOS-side ODT setting circuit 702N, and a selector 703 supply control signals to the PMOS transistor group 701P and the NMOS transistor group 701N. The PMOS-side ODT setting circuit 702P, the NMOS-side ODT setting circuit 702N, and the selector 703 in FIG. 13 are provided for each OCD circuit 50B (not shown in FIG. 12). Further, a reference resistance setting circuit 702 in FIG. 13 is provided outside the OCD circuit 50B, for example, in the control circuit 60 in FIG. 4.

The PMOS-side ODT setting circuit 702P has a register 702Pr that stores a control signal for turning on/off the transistor MTP, and applies the control signal stored in the register 702Pr to each transistor MTP via the selector 703 to turn on/off each transistor MTP. In addition, the NMOS-side ODT setting circuit 702N has a register 702Nr that stores a control signal for turning on/off the transistor MTN, and applies the control signal stored in the register 702Nr to each transistor MTN to turn on/off each transistor MTN.

The resistance values of the ODT circuit 700, that is, the resistance value between each pad DQ<x> and the power supply terminal and the resistance value between each pad DQ<x> and the reference potential point are determined according to which of the transistors MTP and MTN are turned on (activated). For example, by setting resistance values of the transistors MTP and MTN to mutually different values, such as weighting powers of 2, it is possible to finely adjust the resistance values over a wide range with a small number of transistors.

In the present embodiment, the transistor MTP can be turned on and off by the reference resistance setting circuit 702 as well. The signal FLG1 from the comparator 53 is supplied to the reference resistance setting circuit 702. Based on the signal FLG1, the reference resistance setting circuit 702 obtains an adjustment value (control signal) for matching the resistance value of the transistor MTP with the resistance value of the reference resistor RZQ. The reference resistance setting circuit 702 has a nonvolatile register 702r, stores the obtained control signal in the register 702r, and outputs the control signal stored in the register 702r during ZQ calibration.

The selector 703 is controlled by the control circuit 60 to select the control signal from the reference resistance setting circuit 702 and apply the selected control signal to the transistor MTP during ZQ calibration, and to select the control signal from the PMOS-side ODT setting circuit 702P and applies the selected control signal to the transistor MTP except during ZQ calibration.

Operations

ZQ calibration of the embodiment configured as described above includes a first step of setting the resistance value of the PMOS transistor group 701P of the ODT circuit 700 connected to each pad DQ<x> as the resistance value of the reference resistor for each pad, and a second step of adjusting the on-resistance Ron of the output driver 510 using the ODT circuit 700.

In the first step of the ZQ calibration, the resistance value of the PMOS transistor group 701P of the ODT circuit 700 in each OCD circuit 50B is matched with the resistance value of the reference resistor RZQ. That is, in the first step, a reference resistor RZQ is connected between the pad ZQ and a reference potential point. The control circuit 60 turns on the switches 52, 503 and 504 and causes the selector 703 to select the control signal from the reference resistance setting circuit 702. The reference resistance setting circuit 702 sets the resistance value of the PMOS transistor group 701P to an initial value. In addition, the reference resistance setting circuit 702 turns off the transistor MTN. The transistors MP and MN are also turned off.

Since the switches 52, 503 and 504 are turned on, the pad ZQ and the node PO are electrically connected to each other. Accordingly, a current flows from the power supply terminal to the reference potential point via the turned-on transistor MTP of the PMOS transistor group 701P, the node PO, the switches 504, 503, and 52, the pad ZQ, and the reference resistor RZQ. The comparator 53 compares the voltage of the node PO and the voltage VREF (=VCCQ/2) and outputs the difference between the two inputs to the reference resistance setting circuit 702 as the signal FLG1.

The reference resistance setting circuit 702 continually changes the resistance value of the PMOS transistor group 701P (the resistance value of the reference resistor for each pad) based on the signal FLG1 which is also continually changing, to try to match the resistance value of the PMOS transistor group 701P with the resistance value of the reference resistor RZQ, until the signal FLG1 converges to a predetermined value. The reference resistance setting circuit 702 stores an adjustment value (control signal) in the register 702r when the resistance value of the PMOS transistor group 701P matches the resistance value of the reference resistor RZQ.

By sequentially switching the OCD circuits 50B whose switches 503 and 504 are turned on by the control circuit 60, the reference resistance setting circuit 702 sequentially obtains adjustment values for matching the resistance value of the PMOS transistor group 701P of each OCD circuit 50B with the resistance value of the reference resistor RZQ, and stores the adjustment value for each OCD circuit 50B in the register 702r.

In the second step, the adjustment of the on-resistance Ron of the transistor MN in the output driver 510 and the adjustment of the on-resistance Ron of the transistor MP are performed separately. First, the adjustment of the on-resistance Ron of the transistor MN is performed. Also in the second step, the control circuit 60 causes the selector 703 to select the output of the reference resistance setting circuit 702. The reference resistance setting circuit 702 is controlled by the control circuit 60 to set the adjustment value obtained in the first step to the PMOS transistor group 701P, thereby matching the resistance value of the PMOS transistor group 701P with the resistance value of the reference resistor RZQ. That is, the PMOS-side ODT setting circuit 702P and the NMOS-side ODT setting circuit 702N are controlled by the control circuit 60 to turn on the transistor MTP and turn off the transistor MTN according to the adjustment value. Further, the Ron setting circuit 610 is controlled by the control circuit 60 to turn off the transistor MP and turn on the transistor MN in accordance with the initial value. The control circuit 60 also turns off the switch 503 and turns on the switch 504 to apply the voltage VREF from the VREF supply circuit 502 to the comparator 501.

The switch 503 is turned off, and a current flows from the power supply terminal to the reference potential point via the current path of the transistor MTP of the PMOS transistor group 701P, the node PO, and the transistor MN turned on by the initial setting. The comparator 501 is supplied with the voltage of the node PO and the voltage VREF from the VREF supply circuit 502. The comparator 501 compares the voltage of the node PO and the voltage VREF (=VCCQ/2) and outputs the difference between the two inputs to the Ron setting circuit 610 as the signal FLG2.

The NMOS-side Ron setting circuit 611N of the Ron setting circuit 610 continually changes the resistance value of the on-resistance Ron of the transistor MN based on the signal FLG2 which is also continually changing, to try to match the resistance value of the on-resistance Ron of the transistor MN with the resistance value of the PMOS transistor group 701P, until the signal FLG2 converges to a predetermined value. The NMOS-side Ron setting circuit 611N stores an adjustment value when the resistance value of the on-resistance Ron of the transistor MN matches the resistance value of the PMOS transistor group 701P in the register 612N.

Each OCD circuit 50B is provided with a PMOS transistor group 701P whose resistance value is adjusted using a reference resistor RZQ, and adjustment of the on-resistance Ron of the transistor MN can be performed simultaneously in all the OCD circuits 50B.

Next, the adjustment of the on-resistance Ron of the transistor MP is performed. In this case, the control circuit 60 controls the reference resistance setting circuit 702 and the NMOS-side ODT setting circuit 702N to turn off the transistors MTP and MTN. In addition, the control circuit 60 turns off the switch 503 and turns on the switch 504. The control circuit 60 also applies the voltage VREF from the VREF supply circuit 502 to the comparator 501.

The Ron setting circuit 610 outputs an impedance control signal NCODEB based on the adjustment value stored in the register 612N from the NMOS-side Ron setting circuit 611N. Based on the impedance control signal NCODEB, a control signal N is applied to each transistor MN to set the on-resistance Ron of the pull-down circuit 511N. In this state, the PMOS-side Ron setting circuit 611P sets the resistance value of the transistor MP to an initial value.

Certain transistors of the transistors MN based on the control signal N and the transistors MP based on the initial settings are turned on, and conduction is established between the power supply terminal and the reference potential point via the transistors MP and MN that are turned on. Accordingly, a current flows from the power supply terminal to the reference potential point via the turned-on transistor MP and the turned-on transistor MN.

The comparator 501 compares the voltage of the drain of the transistor MN (the voltage of the source of the transistor MP) and the voltage VREF (=VCCQ/2) and outputs the difference between the two inputs to the Ron setting circuit 610 as the signal FLG2. The PMOS-side Ron setting circuit 611P of the Ron setting circuit 610 continually changes the resistance value of the on-resistance Ron of the transistor MP based on the signal FLG2 which is also continually changing, to try to match the resistance value of the on-resistance Ron of the transistor MP with the resistance value of the on-resistance Ron of the transistor MN, until the signal FLG2 converges to a predetermined value. The PMOS-side Ron setting circuit 611P stores an adjustment value when the resistance value of the on-resistance Ron of the transistor MP matches the resistance value of the on-resistance Ron of the transistor MN in the register 612P.

This adjustment of the on-resistance Ron of the transistor MP can also be performed simultaneously in all the OCD circuits 50B. Thereafter, in actual use, the PMOS-side Ron setting circuit 611P provides the NAND circuits 620 to 624 with the impedance control signal PCODEB based on the adjustment value stored in the register 612P, and the NMOS-side Ron setting circuit 611N provides the NAND circuits 640 to 644 with the impedance control signal NCODEB based on the adjustment value stored in the register 612N. Thus, ZQ calibration using the PMOS transistor group 701P can be performed in each OCD circuit 50B, and variations in output characteristics between the OCD circuits 50B can be reduced.

In this way, the same effects as those of the first embodiment can be obtained in the present embodiment as well. Moreover, the present embodiment has an advantage of being able to reduce the circuit area by omitting the resistor circuit that serves as the reference resistor for each pad.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first pad;
   a second pad;
   a first output driver that is provided for the first pad, and configured to output a first transmission signal to the first pad;
   a second output driver that is provided for the second pad, and configured to output a second transmission signal to the second pad;
   a register that stores first and second calibration values;
   a first reference resistor for the first pad, the first reference resistor having a resistance value that is set according to the first calibration value;
   a second reference resistor for the second pad, the second reference resistor having a resistance value that is set according to the second calibration value;
   a first setting circuit configured to calibrate a resistance value of the first output driver using the first reference resistor;
   a second setting circuit configured to calibrate a resistance value of the second output driver using the second reference resistor; and
   a reference resistance setting circuit configured to calibrate the resistance value of the first reference resistor and the resistance value of the second reference resistor, wherein
   the reference resistance setting circuit is configured to calibrate the resistance values of the first and second reference resistors in series, and
   the first and second setting circuits are configured to calibrate the resistance values of the first and second output drivers independently and in parallel.

2. The semiconductor device according to claim 1, wherein
   the first reference resistor is provided in a path between a power supply terminal and a node between the first pad and an output terminal of the first output driver, and
   the second reference resistor is provided in a path between the power supply terminal and a node between the second pad and an output terminal of the second output driver.

3. The semiconductor device according to claim 1, further comprising:
   a third pad to which the external reference resistor is connected;
   a first switch that is provided for the first pad in a path between the third pad and a node between the first pad and an output terminal of the first output driver; and
   a second switch that is provided for the second pad in a path between the third pad and a node between the second pad and an output terminal of the second output driver.

4. The semiconductor device according to claim 3, further comprising:
   a first comparator configured to compare a voltage on a path between the first switch and the third pad with a reference voltage, and then a voltage on a path between the second switch and the third pad with the reference voltage,
   wherein the reference resistance setting circuit is configured to calibrate the resistance value of the first reference resistor until an output of the first comparator converges to a predetermined value, and to calibrate the resistance value of the second reference resistor until an output of the first comparator converges to a predetermined value.

5. The semiconductor device according to claim 4, further comprising:
   a second comparator that is provided for the first pad, and configured to compare a voltage on a path between the first pad and the output terminal of the first output driver with a reference voltage; and
   a third comparator that is provided for the second pad, and configured to compare a voltage on a path between the second pad and the output terminal of the second output driver with the reference voltage, wherein
   the first setting circuit is configured to calibrate the resistance value of the first output driver until an output of the second comparator converges to a predetermined value, and
   the second setting circuit is configured to calibrate the resistance value of the second output driver until an output of the third comparator converges to a predetermined value.

6. The semiconductor device according to claim 5, wherein
   the second comparator includes a first reception receiver that is configured to compare a reception signal received via the first pad with the reference voltage, and
   the third comparator includes a second reception receiver that is configured to compare a reception signal received via the second pad with the reference voltage.

7. The semiconductor device according to claim 1, wherein
   the first reference resistor is a first terminating resistor that includes first and second groups of transistors that are turned on or off according to control signals from the first setting circuit, and
   the second reference resistor is a second terminating resistor that includes third and fourth groups of transistors that are turned on or off according to control signals from the second setting circuit.

8. The semiconductor device according to claim 7, wherein
a first node in a path between the first pad and an output terminal of the first output driver is connected to drains of the first and second groups of transistors, and
a second node in a path between the second pad and an output terminal of the second output driver is connected to drains of the third and fourth groups of transistors.

9. The semiconductor device according to claim 1, wherein
the first output driver includes a pull-up circuit having a plurality of first transistors and a pull-down circuit having a plurality of second transistors, and the first setting circuit is configured to control the first and second transistors in accordance with the calibrated resistance value of the first output driver, and
the second output driver includes a pull-up circuit having a plurality of third transistors and a pull-down circuit having a plurality of fourth transistors, and the second setting circuit is configured to control the third and fourth transistors in accordance with the calibrated resistance value of the second output driver.

10. The semiconductor device according to claim 1, wherein
the reference resistance setting circuit is configured to calibrate the resistance value of the first reference resistor and the resistance value of the second reference resistor using an external reference resistor and store in the register results of calibrating the resistance value of the first reference resistor and the resistance value of the second reference resistor as the first and second calibration values, respectively.

11. A method of calibrating resistance values of a plurality of output drivers of a semiconductor device that includes a first pad, a second pad, a first output driver that is provided for the first pad and configured to output a first transmission signal to the first pad, a second output driver that is provided for the second pad and configured to output the second transmission signal to the second pad, a register that stores first and second calibration values, a first reference resistor for the first pad, the first reference resistor having a resistance value that is set according to the first calibration value, a second reference resistor for the second pad, the second reference resistor having a resistance value that is set according to the second calibration value, said method comprising:
calibrating resistance value of the first reference resistor and the resistance value of the second reference resistor using an external reference resistor;
storing results of calibrating the resistance value of the first reference resistor and the resistance value of the second reference resistor in the register as the first and second calibration values, respectively;
calibrating a resistance value of the first output driver using the first reference resistor; and
calibrating a resistance value of the second output driver using the second reference resistor, wherein
the resistance value of the first reference resistor and the resistance value of the second reference resistor are calibrated in series, and
the resistance value of the first output driver and the resistance value of the second output driver are calibrated in parallel.

12. The method according to claim 11, wherein
the first reference resistor is provided in a path between a power supply terminal and a node between the first pad and an output terminal of the first output driver, and
the second reference resistor is provided in a path between the power supply terminal and a node between the second pad and an output terminal of the second output driver.

13. The method according to claim 12, wherein the semiconductor device further includes:
a third pad to which the external reference resistor is connected;
a first switch that is operated to connect a path between the third pad and a node between the first pad and an output terminal of the first output driver when the resistance value of the first reference resistor is calibrated; and
a second switch that is operated to connect a path between the third pad and a node between the second pad and an output terminal of the second output driver when the resistance value of the second reference resistor is calibrated.

14. The method according to claim 13, wherein
the step of calibrating the resistance value of the first reference resistor includes repeatedly adjusting a resistance of the first reference resistor and comparing a voltage on a path between the first switch and the third pad with a reference voltage, until a difference between the voltage on the path between the first switch and the third pad and the reference voltage converges to a predetermined value, and
the step of calibrating the resistance value of the second reference resistor includes repeatedly adjusting a resistance of the second reference resistor and comparing a voltage on a path between the second switch and the third pad with the reference voltage until a difference between the voltage on the path between the second switch and the third pad and the reference voltage converges to a predetermined value.

15. The method according to claim 14, wherein
the step of calibrating the resistance value of the first output driver includes repeatedly adjusting a resistance of the first output driver and comparing a voltage on a path between the first pad and the output terminal of the first output driver with the reference voltage until a difference between the voltage on the path between the first pad and the output terminal of the first output driver and the reference voltage converges to a predetermined value; and
the step of calibrating the resistance value of the second output driver includes repeatedly adjusting a resistance of the second output driver and comparing a voltage on a path between the second pad and the output terminal of the second output driver with the reference voltage until a difference between the voltage on the path between the second pad and the output terminal of the second output driver and the reference voltage converges to a predetermined value.

16. The method according to claim 11, wherein:
the first reference resistor is a first terminating resistor that includes first and second groups of transistors that are turned on or off during said calibrating of the first reference resistor;
the second reference resistor is a second terminating resistor that includes third and fourth groups of transistors that are turned on or off during said calibrating of the second reference resistor;

a first node in a path between the first pad and an output terminal of the first output driver is connected to drains of the first and second groups of transistors; and a second node in a path between the second pad and an output terminal of the second output driver is connected to drains of the third and fourth groups of transistors.

17. A semiconductor device comprising:

a first pad;

a second pad;

a first output driver that is provided for the first pad and configured to output a first transmission signal to the first pad, the first output driver including a first pull-up circuit having a plurality of first transistors and a first pull-down circuit having a plurality of second transistors;

a second output driver that is provided for the second pad and configured to output a second transmission signal to the second pad, the second output driver including a second pull-up circuit having a plurality of third transistors and a second pull-down circuit having a plurality of fourth transistors;

a register that stores first and second calibration values;

a first reference resistor for the first pad, the first pull-up circuit and the first pull-down circuit, the first reference resistor having a first resistance value that is set according to the first calibration value;

a second reference resistor for the second pad, the second pull-up circuit, the second reference resistor having a second resistance value that is set according to the second calibration value;

a first setting circuit configured to calibrate a resistance value of the first output driver using the first reference resistor; and a second setting circuit configured to calibrate a resistance value of the second output driver using the second reference resistor, wherein the first setting circuit is configured to control the first transistors of the first pull-up circuit and the second transistors of the first pull-down circuit in accordance with the calibrated resistance value of the first reference resistor, and the second setting circuit is configured to control the third transistors of the second pull-up circuit and the fourth transistors of the second pull-down circuit in accordance with the calibrated resistance value of the second reference resistor.

18. The semiconductor device according to claim 17, wherein the first reference resistor is provided in a path between a power supply terminal and a node between the first pad and an output terminal of the first output driver, and the second reference resistor is provided in a path between the power supply terminal and a node between the second pad and an output terminal of the second output driver.

19. The semiconductor device according to claim 17, further comprising:

a third pad to which the external reference resistor is connected;

a first switch that is provided for the first pad in a path between the third pad and a node between the first pad and an output terminal of the first output driver; and a second switch that is provided for the second pad in a path between the third pad and a node between the second pad and an output terminal of the second output driver.

20. The semiconductor device according to claim 17, wherein the first reference resistor is a first terminating resistor that includes first and second groups of transistors that are turned on or off according to control signals from the first setting circuit, and the second reference resistor is a second terminating resistor that includes third and fourth groups of transistors that are turned on or off according to control signals from the second setting circuit.

* * * * *